(12) United States Patent
Kim et al.

(10) Patent No.: US 10,825,800 B2
(45) Date of Patent: *Nov. 3, 2020

(54) SEMICONDUCTOR PACKAGE INCLUDING HEAT SINK

(71) Applicant: SAMSUNG ELECTRONICS CO., LTD., Suwon-si (KR)

(72) Inventors: Tae-sung Kim, Cheonan-si (KR); Cheol-woo Lee, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/572,866

(22) Filed: Sep. 17, 2019

(65) Prior Publication Data

US 2020/0013757 A1 Jan. 9, 2020

Related U.S. Application Data

(63) Continuation of application No. 16/005,749, filed on Jun. 12, 2018, now Pat. No. 10,453,882.

(30) Foreign Application Priority Data

Dec. 4, 2017 (KR) ........................ 10-2017-0165226

(51) Int. Cl.
*H01L 25/065* (2006.01)
*H01L 21/56* (2006.01)
(Continued)

(52) U.S. Cl.
CPC .......... *H01L 25/0657* (2013.01); *H01L 21/56* (2013.01); *H01L 23/295* (2013.01);
(Continued)

(58) Field of Classification Search
CPC . H01L 25/0657; H01L 21/4882; H01L 21/56; H01L 23/3675; H01L 23/3677;
(Continued)

(56) References Cited

U.S. PATENT DOCUMENTS 5,847,929 A 12/1998 Bernier et al.
6,589,813 B1 7/2003 Park
(Continued)

FOREIGN PATENT DOCUMENTS

| JP | H08-116012 A | 5/1996 |
| JP | H10-4260 A | 1/1998 |
| JP | 2006-114826 A | 4/2006 |

OTHER PUBLICATIONS

Diggle, J.W., et al., "Anodic oxide films on aluminum", Chemical Reviews, 69 (3), 365-405 (1969).
(Continued)

*Primary Examiner* — Fernando L Toledo
*Assistant Examiner* — Neil R Prasad
(74) *Attorney, Agent, or Firm* — Lee IP Law, P.C.

(57) ABSTRACT

A semiconductor package including a package base substrate; at least one semiconductor chip on the package base substrate; a heat sink attached on the at least one semiconductor chip, the heat sink including a base and a plurality of protrusion patterns on a top of the base; and a molding covering a top of the package base substrate, a side surface of the at least one semiconductor chip, and a side surface of the heat sink without covering a top of the heat sink.

19 Claims, 25 Drawing Sheets

(51) Int. Cl.
*H01L 23/367* (2006.01)
*H01L 23/552* (2006.01)
*H01L 23/29* (2006.01)
*H01L 25/00* (2006.01)
*H01L 21/48* (2006.01)
*H01L 23/31* (2006.01)

(52) U.S. Cl.
CPC ...... *H01L 23/3675* (2013.01); *H01L 23/3677* (2013.01); *H01L 23/552* (2013.01); *H01L 25/50* (2013.01); *H01L 21/4882* (2013.01); *H01L 23/3128* (2013.01); *H01L 23/367* (2013.01); *H01L 2224/0401* (2013.01); *H01L 2224/04042* (2013.01); *H01L 2224/16227* (2013.01); *H01L 2224/32225* (2013.01); *H01L 2224/48145* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/06506* (2013.01); *H01L 2225/06537* (2013.01); *H01L 2225/06562* (2013.01); *H01L 2225/06586* (2013.01); *H01L 2225/06589* (2013.01); *H01L 2924/15311* (2013.01)

(58) Field of Classification Search
CPC ......... H01L 23/552; H01L 2225/06506; H01L 2225/0651; H01L 2225/06537; H01L 2225/06586; H01L 2225/06589
See application file for complete search history.

(56) References Cited

U.S. PATENT DOCUMENTS

| | | | |
|---|---|---|---|
| 6,719,871 | B2 | 4/2004 | Egitto et al. |
| 6,770,513 | B1 | 8/2004 | Vikram et al. |
| 7,476,967 | B2 | 1/2009 | Dubin |
| 8,008,133 | B2 | 8/2011 | Tosaya et al. |
| 8,304,291 | B2 | 11/2012 | Touzelbaev et al. |
| 2008/0169552 | A1 | 7/2008 | Taya et al. |
| 2011/0272824 | A1 | 11/2011 | Pagaila |
| 2012/0014068 | A1 | 1/2012 | Nakanishi et al. |
| 2012/0299173 | A1 | 11/2012 | Mohammed et al. |
| 2012/0326339 | A1 | 12/2012 | Suzuya et al. |
| 2013/0133859 | A1 | 5/2013 | Glover et al. |
| 2013/0139524 | A1 | 6/2013 | Kim et al. |
| 2014/0085829 | A1 | 3/2014 | Yamashita |
| 2015/0255429 | A1 | 9/2015 | Katkar et al. |
| 2017/0141014 | A1 | 5/2017 | Cadag et al. |
| 2017/0309540 | A1 | 10/2017 | Temmei et al. |
| 2017/0358517 | A1* | 12/2017 | Matsubara ............ H01L 23/373 |

OTHER PUBLICATIONS

Itaya, Kingo, et al., "Properties of Porous Anodic Aluminum Oxide Films as Membranes", Journal of Chemical Engineering of Japan, vol. 17, No. 5, 514-520, (1984).

* cited by examiner

SEMICONDUCTOR PACKAGE INCLUDING HEAT SINK

CROSS-REFERENCE TO RELATED APPLICATIONS

This is a continuation application based on pending application Ser. No. 16/005,749, filed Jun. 12, 2018, the entire contents of which is hereby incorporated by reference.

Korean Patent Application No. 10-2017-0165226, filed on Dec. 4, 2017, in the Korean Intellectual Property Office, and entitled: "Semiconductor Package Including Heat Sink," is incorporated by reference herein in its entirety.

BACKGROUND

1. Field

Embodiments relate to a semiconductor package including a heat sink.

2. Description of the Related Art

As the electronic industry rapidly advances and the requirements of users increase, the performance of semiconductor packages may be further increased and their size may be further decreased.

SUMMARY

The embodiments may be realized by providing a semiconductor package including a package base substrate; at least one semiconductor chip on the package base substrate; a heat sink attached on the at least one semiconductor chip, the heat sink including a base and a plurality of protrusion patterns on a top of the base; and a molding covering a top of the package base substrate, a side surface of the at least one semiconductor chip, and a side surface of the heat sink without covering a top of the heat sink.

The embodiments may be realized by providing a semiconductor package including a package base substrate; at least one semiconductor chip on the package base substrate; a heat sink attached on the at least one semiconductor chip, the heat sink including a base and a plurality of protrusion patterns on a top of the base; a heat sink attach film covering a bottom of the heat sink, the heat sink attach film being between the heat sink and the at least one semiconductor chip; a conductive heat dissipation terminal passing through the heat sink attach film to contact the heat sink; a molding covering a top of the package base substrate, a side surface of the at least one semiconductor chip, and a side surface of the heat sink; and an electromagnetic shield covering a side surface of the package base substrate, a side surface and a top of the molding, and a top of the heat sink.

The embodiments may be realized by providing a semiconductor package including a package base substrate; a semiconductor chip on the package base substrate; a heat sink attached on the semiconductor chip, the heat sink including a base and a plurality of protrusion patterns on a top of the base; a heat sink attach film covering a bottom of the heat sink, the heat sink attach film being between the heat sink and the semiconductor chip; a bonding wire electrically connecting the semiconductor chip to the package base substrate, a portion of the bonding wire being buried in the heat sink attach film; a molding covering a top of the package base substrate, a side surface of the semiconductor chip, and a side surface of the heat sink; and an electromagnetic shield contacting a side surface of the package base substrate, a side surface and a top of the molding, and a top of the heat sink.

BRIEF DESCRIPTION OF THE DRAWINGS

Features will be apparent to those of skill in the art by describing in detail exemplary embodiments with reference to the attached drawings in which:

FIGS. 6 to 10A and 11 illustrate cross-sectional views of stages in a process of manufacturing a heat sink according to an embodiment;

DETAILED DESCRIPTION

Figure 1:
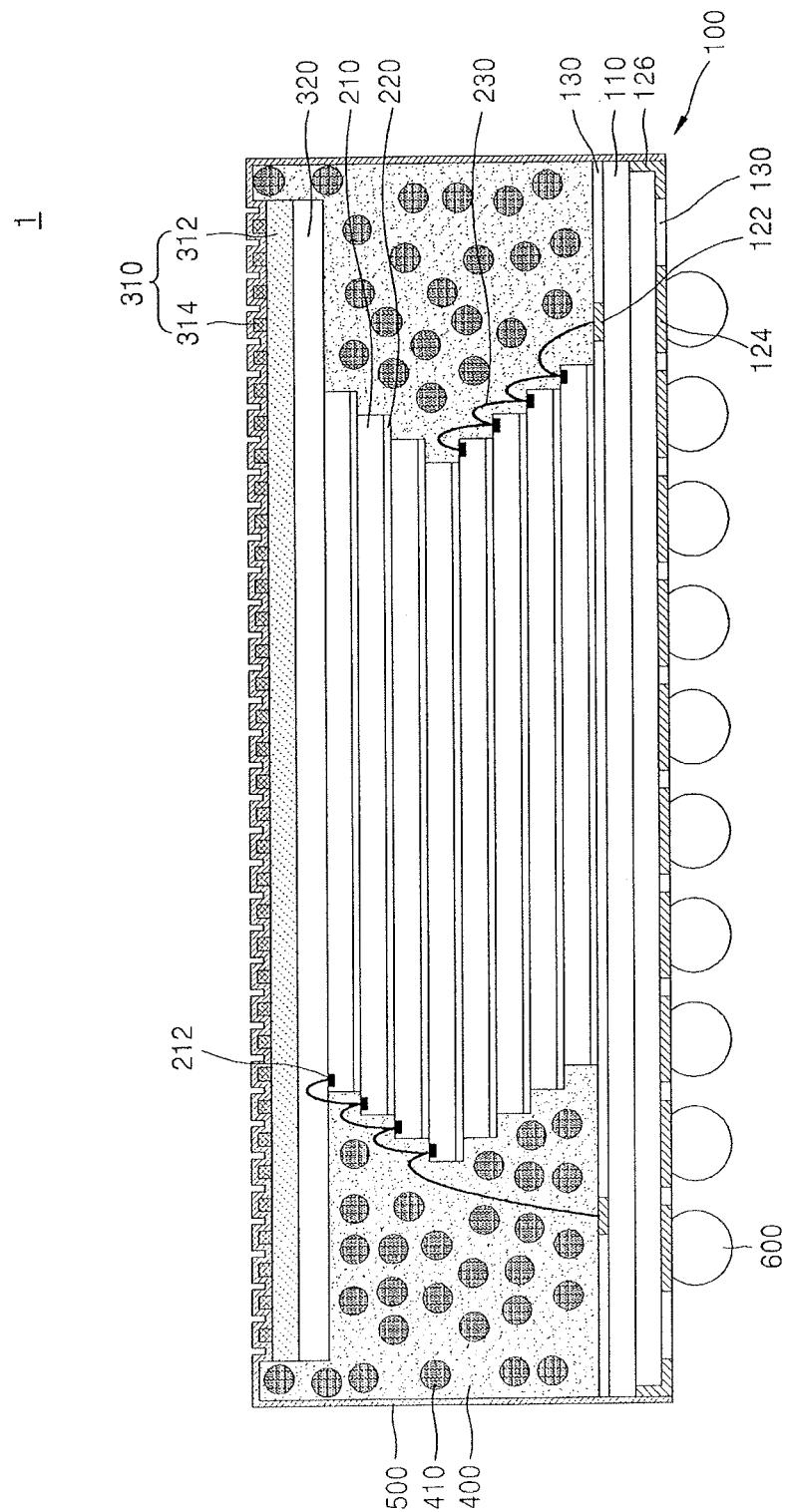
FIG. 1 illustrates a cross-sectional view of a semiconductor package according to an embodiment.

FIG. 1 illustrates a cross-sectional view of a semiconductor package 1 according to an embodiment.

Referring to FIG. 1, the semiconductor package 1 may include a package base substrate 100, at least one semiconductor chip 210, and a heat sink 310.

In an implementation, the package base substrate 100 may be a printed circuit board (PCB). For example, the package base substrate 100 may be a double-sided PCB or a multi-layer PCB. The package base substrate 100 may include at least one base layer 110, a plurality of first connection pads 122 disposed on a top of the package base substrate 100, and a plurality of second connection pads 124 disposed on a bottom of the package base substrate 100. A solder resist layer 130 may be disposed on each of a top and a bottom of the base layer 110. The plurality of first connection pads 122 and the plurality of second connection pads 124 may respectively be exposed at the top and the bottom of the package base substrate 100 without being covered by the solder resist layer 130. In an implementation, the solder resist layer 130 may not be disposed on the top of the base layer 110 and may be omitted. In an implementation, the package base substrate 100 may include a plurality of base layers 110, which are stacked. For example, the package base substrate 100 may be a multi-layer PCB.

In an implementation, the at least one base layer 110 may include, e.g., a phenol resin, an epoxy resin, or a polyimide. In an implementation, the at least one base layer 110 may include, e.g., flame retardant 4 (FR4), tetrafunctional epoxy, polyphenylene ether, epoxy/polyphenylene oxide, bismaleimide triazine (BT), thermount, cyanate ester, polyimide, or a liquid crystal polymer.

The package base substrate 100 may further include at least one electromagnetic shielding terminal 126. In an implementation, as illustrated in FIG. 1, the at least one electromagnetic shielding terminal 126 may be provided over a side surface and the bottom of the base layer 110. In an implementation, if the at least one electromagnetic shielding terminal 126 contacts a below-described electromagnetic shield 500, the at least one electromagnetic shielding terminal 126 may be provided in the base layer 110 at a suitable position. In an implementation, the at least one electromagnetic shielding terminal 126 may be provided to cover a portion of the side surface of the base layer 110. In an implementation, the at least one electromagnetic shielding terminal 126 may be disposed on the top or the bottom of the base layer 110 so as to be exposed at the side surface of the base layer 110. In an implementation, the at least one electromagnetic shielding terminal 126 may be disposed between the stacked plurality of base layers 110 so as to be exposed at the side surface of the base layer 110.

The plurality of first connection pads 122, the plurality of second connection pads 124, and the at least one electromagnetic shielding terminal 126 may each include, e.g., copper, nickel, stainless steel, or beryllium copper.

A wiring pattern and a conductive via for electrically connecting the plurality of first connection pads 122 to the plurality of second connection pads 124 may be disposed in the package base substrate 100, but for conciseness of illustration, the wiring pattern and the conductive via are omitted. The wiring pattern and the conductive via may each include, e.g., a metal including copper. Some of the wiring pattern and the conductive via may electrically connect the at least one electromagnetic shielding terminal 126 to some, where a ground is provided, of the plurality of second connection pads 124.

At least one semiconductor chip 210 may be mounted on the package base substrate 100. The semiconductor chip 210 may be a semiconductor substrate. The semiconductor substrate may include, e.g., silicon (Si). In an implementation, the semiconductor substrate may include a semiconductor element such as germanium (Ge) or a compound semiconductor such as silicon carbide (SiC), gallium arsenide (GaAs), indium arsenide (InAs), or indium phosphide (InP). The semiconductor substrate may include an active surface and an inactive surface opposite to the active surface. In the semiconductor chip 210, a semiconductor device including various kinds of a plurality of individual devices may be provided on the active surface.

In an implementation, the semiconductor chip 210 may be a central processor unit (CPU), a microprocessor unit (MPU), a graphic processor unit (GPU), an application processor (AP), or the like. In an implementation, the semiconductor chip 210 may be a non-volatile memory semiconductor chip such as flash memory, phase-change random access memory (PRAM), magneto resistive random access memory (MRAM), ferroelectric random access memory (FeRAM), resistive random access memory (RRAM), or the like. The flash memory may be, e.g., V-NAND flash memory. In an implementation, the semiconductor chip 210 may be a volatile memory semiconductor chip such as dynamic random access memory (DRAM), static random access memory (SRAM), or the like. In an implementation, the semiconductor chip 210 may be a controller semiconductor chip for controlling the non-volatile memory semiconductor chip. In an implementation, the semiconductor chip 210 may be provided in plurality, and at least one of the plurality of semiconductor chips 210 may be a dummy silicon spacer chip for supporting the other semiconductor chips 210.

The semiconductor chip 210 may include at least one semiconductor chip pad 212 disposed on an active surface. The at least one semiconductor chip pad 212 may be electrically connected to the plurality of first connection pads 122 and may be electrically connected to the plurality of second connection pads 124 through the wiring pattern and/or the conductive via.

In an implementation, the semiconductor chip 210 may be electrically connected to the package base substrate 100 through a bonding wire 230 that connects the at least one semiconductor chip pad 212 to the plurality of first connection pads 122. In an implementation, the semiconductor chip 210 may be electrically connected to the plurality of first connection pads 122 through a chip connection terminal in a flip chip manner.

The semiconductor package 1 may include a plurality of semiconductor chips 210. In an implementation, the plurality of semiconductor chips 210 may be sequentially stacked in a stepped form by using a die attach film 220 attached on a bottom thereof. In an implementation, the plurality of semiconductor chips 210 may be disposed on the package base substrate 100 in a horizontal direction and may be spaced apart from each other, or may be stacked and disposed on the package base substrate 100 in a vertical direction. In an implementation, some of the plurality of semiconductor chips 210 may be disposed on the package base substrate 100 in the horizontal direction and may be spaced apart from each other, and the other semiconductor chips 210 may be stacked and disposed on the package base substrate 100 in the vertical direction.

The heat sink 310 may be attached on the semiconductor chip 210. The heat sink 310 may be attached on the semiconductor chip 210 with a heat sink attach film 320 therebetween. The heat sink attach film 320 may include a material similar to that of the die attach film 220. The heat sink attach film 320 may have a horizontal area that is approximately the same as a horizontal area of the heat sink 310, e.g., such that the heat sink attach film 320 may cover all of or completely overlap with a bottom of the heat sink 310. In an implementation, a thickness of the heat sink attach film 320 may be greater than a thickness of the die attach film 220. A portion of the bonding wire 230 connected to the semiconductor chip pad 212 of the semiconductor chip 210 may be buried in the heat sink attach film 320. For example, an uppermost end of the bonding wire 230 may be disposed on a level that is lower than (e.g., closer to the package base substrate 100) the bottom (e.g., a bottom of a base 312) of the heat sink 310. Therefore, the bonding wire 230 may be spaced apart from the heat sink 310 without contacting the heat sink 310.

In an implementation, a horizontal area of the heat sink 310 may be less than a horizontal area of the package base substrate 100 (e.g., the package base substrate 100 may have a length and/or width that is greater than that of the heat sink 310 such that a total area of a major surface of the package base substrate 100 is greater than a total area of a major, facing surface of the heat sink 310).

In an implementation, the horizontal area of the heat sink 310 may be greater than a horizontal area of the semiconductor chip 210 (e.g., the heat sink 310 may be larger in plan view than the semiconductor chip 210). For example, in a case where the semiconductor package 1 includes the plurality of semiconductor chips 210 that are sequentially stacked in a stepped form, the heat sink 310 may have a horizontal area that is large enough or sufficient to overlap or completely overlie all of the plurality of semiconductor chips 210 in a vertical direction (e.g., a direction orthogonal to the major surface of the package base substrate 100). In an implementation, the horizontal area of the heat sink 310 may be approximately the same as the horizontal area of the semiconductor chip 210. In an implementation, in a case where the semiconductor package 1 includes the plurality of semiconductor chips 210 having different areas, the horizontal area of the heat sink 310 may be approximately the same as a horizontal area of an uppermost semiconductor chip 210 of the plurality of semiconductor chips 210 (e.g., closest to the heat sink 310).

The heat sink 310 may include the base 312 and a plurality of protrusion patterns 314 disposed on a top of the base 312. In an implementation, the plurality of protrusion patterns 314 may be disposed on the top of the base 312 to have a honeycomb structure. The plurality of protrusion patterns 314 may each have a circular horizontal cross-sectional shape. In an implementation, a horizontal width and a vertical height of each of the plurality of protrusion patterns 314 may be several nm to tens nm. In an implementation, two adjacent protrusion patterns of the plurality of protrusion patterns 314 may be disposed on the top of the base 312 to have an interval of several nm to several μm.

The base 312 and the plurality of protrusion patterns 314 may each include metal. For example, the base 312 may include aluminum. For example, the plurality of protrusion patterns 314 may include aluminum, copper, or the like.

The semiconductor package 1 may further include a molding 400. The molding 400 may include a filler 410. For example, the molding 400 may include an epoxy-based material including the filler 410. In an implementation, an amount of the filler 410 included in the molding 400 may be about 55 wt % to 85 wt %. The filler 410 may be, e.g., a silica filler. An average diameter of particles of the filler 410 may be, e.g., 0.1 micron to tens of microns.

In the drawings, the filler 410 is exaggerated and greatly illustrated for relative comparison with a size of each of the protrusion patterns 314. Therefore, a relative size of the filler 410 with respect to elements other than the protrusion patterns 314 may be irrelevant to the illustration of the drawings.

The molding 400 may surround the semiconductor chip 210 and the heat sink 310 on the package base substrate 100. The molding 400 may cover, e.g., a top of the package base substrate 100, a side surface of the semiconductor chip 210, and a side surface of the heat sink 310. The molding 400 may be formed as an exposed-type mold that does not cover the top of the heat sink 310 (e.g., the side of the heat sink 310 that faces away from the package base substrate 100).

An uppermost end of the molding 400 and an uppermost end of the heat sink 310 may be disposed on approximately the same level (e.g., may be coplanar). For example, the uppermost end of the molding 400 and tops of the plurality of protrusion patterns 314 of the heat sink 310 may be disposed on approximately the same level.

A diameter of the particles of the filler 410 included in the molding 400 may be greater than an interval between the protrusion patterns of the plurality of protrusion patterns 314. For example, the interval between the plurality of protrusion patterns 314 may be several nm to tens of nm, and the diameter of the filler 410 may be 0.1 micron to tens of microns.

The diameter of the particles of the filler 410 included in the molding 400 may be greater than the interval between the plurality of protrusion patterns 314, and, in a process of forming the molding 400, the filler 410 may plug a space between the plurality of protrusion patterns 314 disposed adjacent to an edge of the top of the heat sink 310, and thus, the molding 400 may not cover the top of the heat sink 310.

The molding 400 not covering the top of the heat sink 310 may denote that a greater portion of the top of the heat sink 310 is exposed without being covered by the molding 400, instead of implying that the molding 400 does not fully cover the top of the heat sink 310 or any portion of the top of the heat sink 310. For example, the molding 400 may cover a relatively small portion adjacent to the edge of the top of the heat sink 310, but may not cover a greater portion of an inner portion of the top of the heat sink 310.

The electromagnetic shield 500 may be provided on a surface of the semiconductor package 1. The electromagnetic shield 500 may cover all of the surface except for a bottom of the semiconductor package 1. For example, the electromagnetic shield 500 may cover a side surface of the package base substrate 100, a side surface and a top of the molding 400, and the top of the heat sink 310. The electromagnetic shield 500 may directly contact the side surface of the package base substrate 100 and the side surface and the top of the molding 400. The molding 400 may be formed as an exposed-type mold that does not cover the top of the heat sink 310, and thus, the electromagnetic shield 500 may directly contact the top of the heat sink 310.

In an implementation, the electromagnetic shield 500 may cover a portion of the bottom of the semiconductor package 1.

The electromagnetic shield 500 may be formed on a surface of the semiconductor package 1 in a conformal shielding manner. The electromagnetic shield 500 may form an embossing pattern that is conformally formed along a side surface and a top of each of the plurality of protrusion patterns 314 and a surface of the base 312 between the plurality of protrusion patterns 314, on the heat sink 310 where the plurality of protrusion patterns 314 are disposed. In an implementation, the electromagnetic shield 500 may form the embossing pattern which fills the space between plurality of protrusion patterns 314 on the heat sink 310 where the plurality of protrusion patterns 314 are disposed and onto which a shape of the plurality of protrusion patterns 314 is transferred. For example, a top of the electromagnetic shield 500 may have a concave-convex structure on the heat sink 310.

The electromagnetic shield 500 may include a conductive material. The electromagnetic shield 500 may include, e.g., metal materials such as silver (Ag), copper (Cu), nickel (Ni), aluminum (Al), tin (Sn), or stainless steel, conductive carbon materials such as carbon black, carbon nanotube (CNT), or graphite, metal-coated materials such as Ag/Cu, Ag/glass fiber, or Ni/graphite, or conductive polymer materials such as polypyrrole and polyaniline.

The electromagnetic shield 500 may contact the at least one electromagnetic shielding terminal 126. For example, the electromagnetic shield 500 may contact the at least one electromagnetic shielding terminal 126 in the side surface of the package base substrate 100.

The semiconductor package 1 may further include a plurality of external connection terminals 600. The plurality of external connection terminals 600 may each be, e.g., a solder ball or a bump. The plurality of external connection terminals 600 may be attached on the plurality of second connection pads 124 on the bottom of the package base substrate 100.

In the semiconductor package 1 according to an embodiment, heat generated in the semiconductor package 1 (e.g., the semiconductor chip 210) may be effectively dissipated by the heat sink 310 including the top that is exposed without being covered by the molding 400. The plurality of protrusion patterns 314 formed by filling a metal material into a through hole of an anodically oxidized aluminum oxide layer may be disposed on the top of the heat sink 310, and thus, a surface area of the heat sink 310 may increase. Accordingly, heat dissipation efficiency may increase without any increase in volume of the semiconductor package 1 or area of the top of the semiconductor package 1.

The plurality of protrusion patterns 314 included in the heat sink 310 may be disposed on a level that is approximately the same as an uppermost end of the molding 400. Accordingly, the plurality of protrusion patterns 314 may not protrude to a level that is higher than the top of the molding 400, thereby preventing the plurality of protrusion patterns 314 from being damaged.

In an implementation, in the semiconductor package 1 according to the embodiments, the electromagnetic shield 500 may form the embossing pattern on the heat sink 310 where the plurality of protrusion patterns 314 are disposed, and the heat sink 310 may act as a shield, and due to an effect of the embossing pattern, an electromagnetic wave radiated from the inside of the semiconductor package 1 to the top of the semiconductor package 1 may be efficiently reflected and absorbed, thereby preventing the electromagnetic wave from being radiated outside of the semiconductor package 1.

Figure 2:
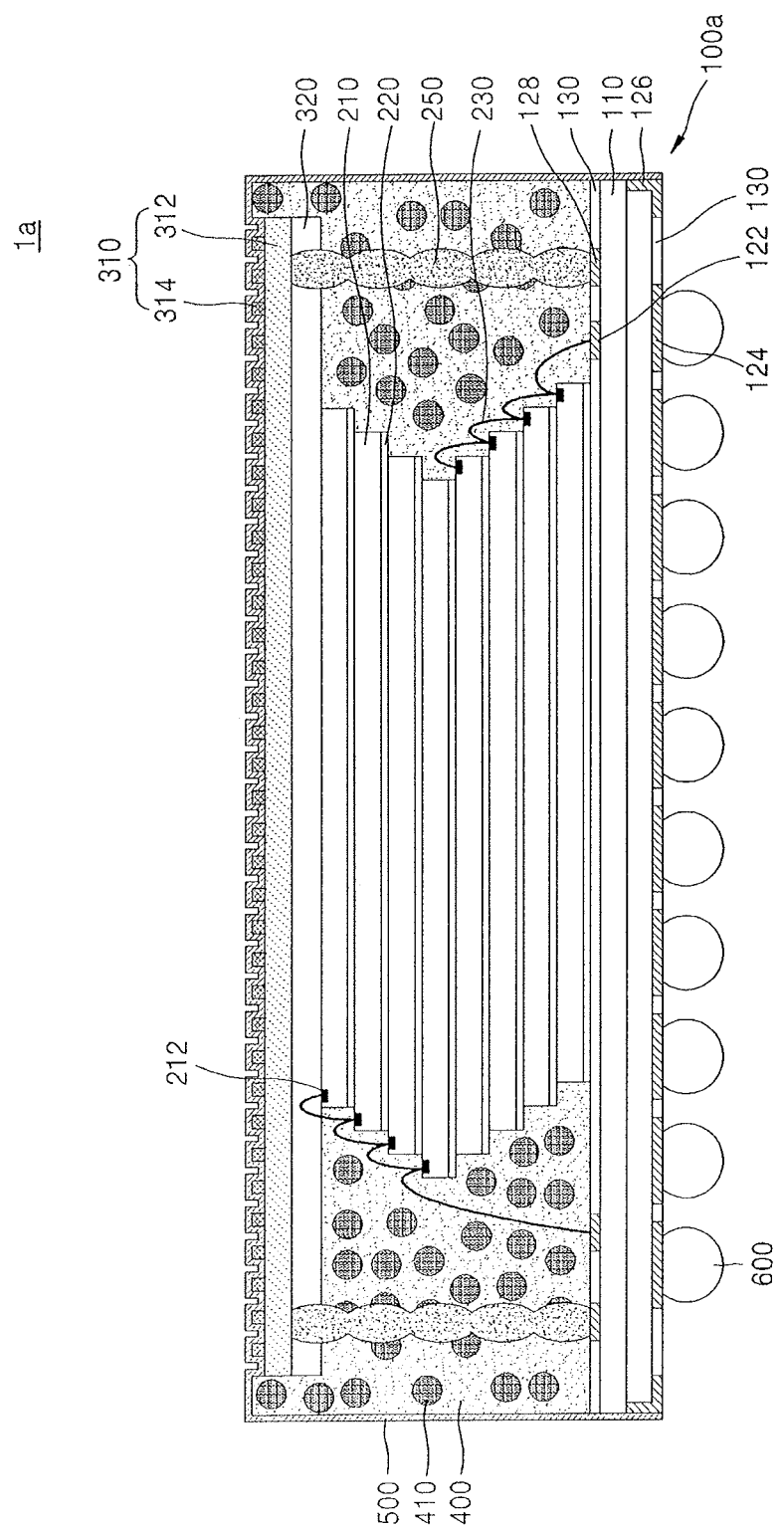
FIG. 2 illustrates a cross-sectional view of a semiconductor package according to an embodiment.

FIG. 2 illustrates a cross-sectional view of a semiconductor package 1a according to an embodiment.

Referring to FIG. 2, the semiconductor package 1a may include a package base substrate 100a, a semiconductor chip 210, and a heat sink 310.

The package base substrate 100a may include at least one base layer 110, a plurality of first connection pads 122 on a top of the package base substrate 100a, a plurality of second connection pads 124 on a bottom of the package base substrate 100a, at least one electromagnetic shielding terminal 126 exposed at a side surface of the base layer 110, and a heat transfer pad 128 on the top of the package base substrate 100a.

At least one semiconductor chip 210 may be mounted on the package base substrate 100a. The semiconductor chip 210 may include at least one semiconductor chip pad 212. The at least one semiconductor chip pad 212 may be electrically connected to the plurality of first connection pads 122. In an implementation, the semiconductor chip 210 may be electrically connected to the package base substrate 100a through a bonding wire 230 that connects the at least one semiconductor chip pad 212 to the plurality of first connection pads 122.

The semiconductor package 1a may include a plurality of the semiconductor chips 210. In an implementation, the plurality of semiconductor chips 210 may be sequentially stacked in a stepped form by using a die attach film 220 attached on a bottom of each of the semiconductor chips 210.

The heat sink 310 may be attached on the semiconductor chip 210. The heat sink 310 may be attached on the semiconductor chip 210 with a heat sink attach film 320 therebetween. The heat sink 310 may include a base 312 and a plurality of protrusion patterns 314 on the base 312. The plurality of protrusion patterns 314 may be on a top of the base 312 in a honeycomb structure. Each of the plurality of protrusion patterns 314 may have a circular horizontal cross-sectional shape.

The semiconductor package 1a may further include a molding 400. The molding 400 may include a filler 410.

The molding 400 may surround the semiconductor chip 210 and the heat sink 310 on the package base substrate 100a. The molding 400 may cover, e.g., the top of the package base substrate 100a, a side surface of the semiconductor chip 210, and a side surface of the heat sink 310. The molding 400 may be formed as an exposed-type mold that does not cover the top of the heat sink 310. An uppermost end of the molding 400 and an uppermost end of the heat sink 310 may be disposed on approximately the same level. For example, the uppermost end of the molding 400 and tops of the plurality of protrusion patterns 314 of the heat sink 310 may be disposed on the same level. A diameter of the filler 410 included in the molding 400 may be greater than an interval between the plurality of protrusion patterns 314. The molding 400 may not cover a top of the heat sink 310.

The semiconductor package 1a may further include a conductive ball pillar 250 on the top of the package base substrate 100a. The conductive ball pillar 250 may be formed, e.g., by vertically stacking a plurality of solder balls. The conductive ball pillar 250 may be attached on the heat transfer pad 128 on the top of the package base substrate 100a. The conductive ball pillar 250 may pass through the molding 400 and the heat sink attach film 320 and may contact a bottom of the base 312 of the heat sink 310.

The conductive ball pillar 250 may transfer, to the heat sink 310, heat occurring in the package base substrate 100a and/or heat transferred from the semiconductor chip 210 to the package base substrate 100a.

An electromagnetic shield 500 may be provided on a surface of the semiconductor package 1a. The electromagnetic shield 500 may cover all of a surface of the semiconductor package 1a except a bottom of the semiconductor package 1a. For example, the electromagnetic shield 500 may cover a side surface of the package base substrate 100a, a side surface and a top of the molding 400, and a surface of the heat sink 310.

The electromagnetic shield 500 may contact the at least one electromagnetic shielding terminal 126. For example, the electromagnetic shield 500 may contact the at least one electromagnetic shielding terminal 126 at a side surface of the package base substrate 100a.

The semiconductor package 1a may further include a plurality of external connection terminals 600. The plurality of external connection terminals 600 may be attached on the plurality of second connection pads 124 disposed on the bottom of the package base substrate 100a.

In the semiconductor package 1a according to an embodiment, heat occurring in the semiconductor package 1a (e.g., heat occurring in the semiconductor chip 210) may be effectively dissipated to the outside by the heat sink 310 including the top that is exposed without being covered by the molding 400. The plurality of protrusion patterns 314 formed by filling a metal material into a through hole of an anodically oxidized aluminum oxide layer may be on the top of the heat sink 310, and thus, a surface area of the heat sink 310 may increase. Accordingly, heat dissipation efficiency may increase without any increase in volume of the semiconductor package 1a or area of the top of the semiconductor package 1a.

In an implementation, the semiconductor package 1a according to an embodiment may further include the conductive ball pillar 250 connecting the package base substrate 100a to the heat sink 310, heat occurring in the package base substrate 100a and/or heat transferred from the semiconductor chip 210 to the package base substrate 100a may be transferred to the heat sink 310, and thus, may be effectively dissipated to the outside.

The plurality of protrusion patterns 314 included in the heat sink 310 may be on approximately the same level as an uppermost end of the molding 400. Therefore, the plurality of protrusion patterns 314 may not protrude to a level that is higher than the top of the molding 400, thereby preventing the plurality of protrusion patterns 314 from being damaged.

In an implementation, in the semiconductor package 1a according to an embodiment, the electromagnetic shield 500 may form an embossing pattern on the heat sink 310 where the plurality of protrusion patterns 314 are disposed, and thus, may efficiently absorb an electromagnetic wave radiated from the inside of the semiconductor package 1a to the top of the semiconductor package 1a, thereby preventing the electromagnetic wave from being radiated to the outside of the semiconductor package 1a.

Figure 3:
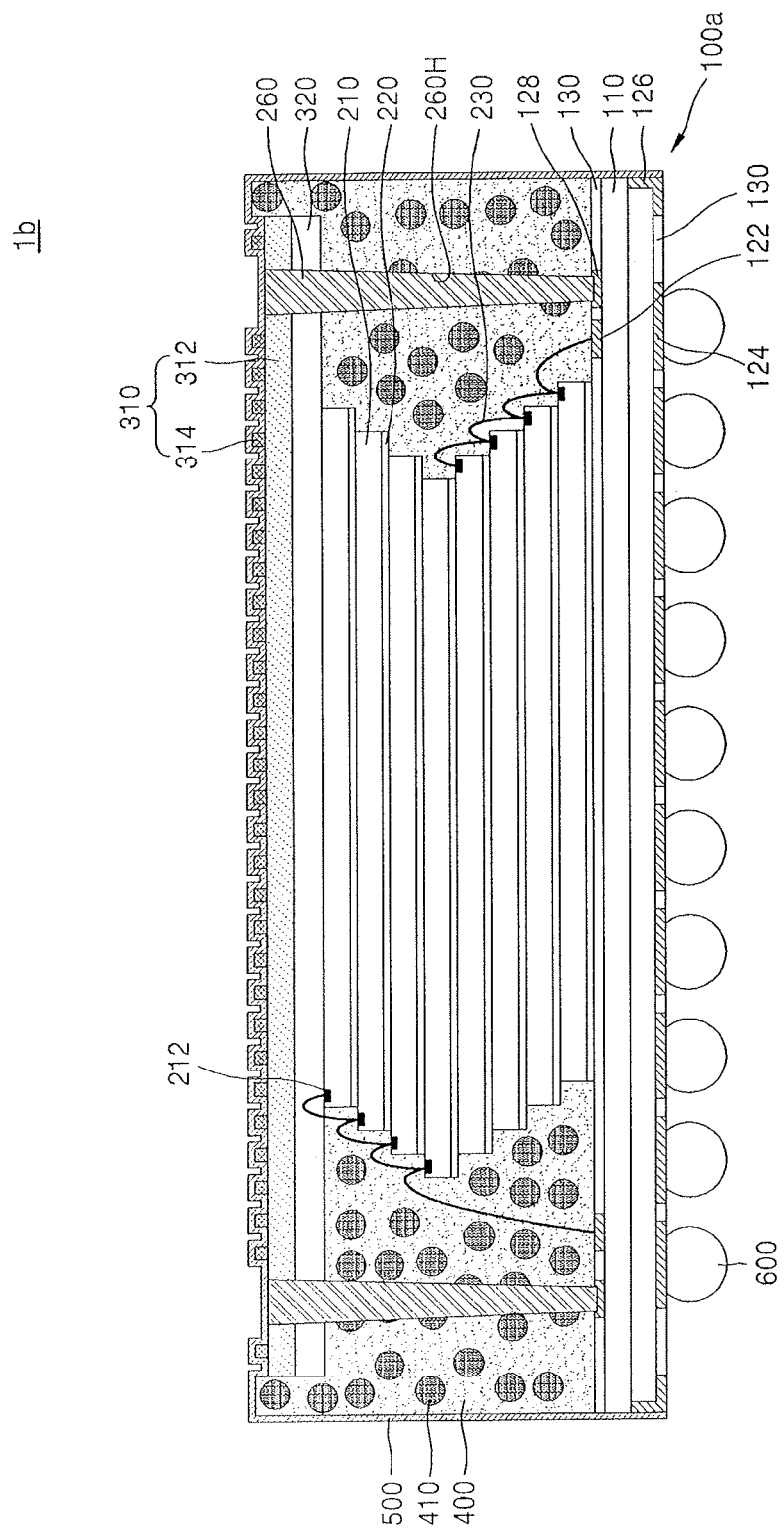
FIG. 3 illustrates a cross-sectional view of a semiconductor package according to an embodiment.

FIG. 3 illustrates a cross-sectional view of a semiconductor package 1b according to an embodiment.

Referring to FIG. 3, the semiconductor package 1b may include a package base substrate 100a, a semiconductor chip 210, and a heat sink 310.

The package base substrate 100a may include at least one base layer 110, a plurality of first connection pads 122 on a top of the package base substrate 100a, a plurality of second connection pads 124 on a bottom of the package base substrate 100a, at least one electromagnetic shielding terminal 126 exposed at a side surface of the base layer 110, and a heat transfer pad 128 on the top of the package base substrate 100a.

At least one semiconductor chip 210 may be mounted on the package base substrate 100a. The semiconductor chip 210 may include at least one semiconductor chip pad 212. The at least one semiconductor chip pad 212 may be electrically connected to the plurality of first connection pads 122. In an implementation, the semiconductor chip 210 may be electrically connected to the package base substrate 100a through a bonding wire 230 that connects the at least one semiconductor chip pad 212 to the plurality of first connection pads 122.

The semiconductor package 1b may include a plurality of the semiconductor chips 210. In an implementation, the plurality of semiconductor chips 210 may be sequentially stacked in a stepped form by using a die attach film 220 attached on a bottom of each of the semiconductor chips 210.

The heat sink 310 may be attached on the semiconductor chip 210. The heat sink 310 may be attached on the semiconductor chip 210 with a heat sink attach film 320 therebetween. The heat sink 310 may include a base 312 and a plurality of protrusion patterns 314 on the base 312. The plurality of protrusion patterns 314 may be on a top of the base 312 in a honeycomb structure. Each of the plurality of protrusion patterns 314 may have a circular horizontal cross-sectional shape.

The semiconductor package 1b may further include a molding 400. The molding 400 may include a filler 410.

The molding 400 may surround the semiconductor chip 210 and the heat sink 310 on the package base substrate 100a. The molding 400 may cover, e.g., the top of the package base substrate 100a, a side surface of the semiconductor chip 210, and a side surface of the heat sink 310. The molding 400 may be formed as an exposed-type mold that does not cover the top of the heat sink 310. An uppermost end of the molding 400 and an uppermost end of the heat sink 310 may be on approximately the same level. For example, the uppermost end of the molding 400 and tops of the plurality of protrusion patterns 314 of the heat sink 310 may be on the same level. A diameter of the filler 410 included in the molding 400 may be greater than an interval between the plurality of protrusion patterns 314. The molding 400 may not cover a top of the heat sink 310.

The semiconductor package 1b may further include a through via hole 260H, that passes through the heat sink 310, the heat sink attach film 320, and the molding 400 to expose a portion of the top of the package base substrate 100a at a bottom thereof, and a conductive through via 260 that fills the through via hole 2601H. The conductive through via 260 may include metal. The conductive through via 260 may include, e.g., metal such as Al, Cu, gold (Au), Ag, or titanium (Ti).

The heat transfer pad 128 may be exposed at the bottom of the through via hole 260H. Therefore, the conductive through via 260 may pass through the heat sink 310, the heat sink attach film 320, and the molding 400 and may contact the heat transfer pad 128, e.g., at the bottom of the through via hole 260H. An upper side surface of the conductive through via 260 may contact the base 312 of the heat sink 310.

A top of the conductive through via 260 may be on approximately the same level as a top of the base 312 of the heat sink 310. The conductive through via 260 may have a tapered shape where a diameter thereof increases in a direction from a bottom to a top thereof, e.g., from the heat transfer pad 128 to the top of the base 312.

Therefore, the conductive through via 260 may transfer, to the heat sink 310, heat occurring in the package base substrate 100a and/or heat transferred from the semiconductor chip 210 to the package base substrate 100a.

An electromagnetic shield 500 may be provided on a surface of the semiconductor package 1b. The electromagnetic shield 500 may cover all of a surface of the semiconductor package 1b except a bottom of the semiconductor package 1b. For example, the electromagnetic shield 500 may cover a side surface of the package base substrate 100a, a side surface and a top of the molding 400, a surface of the heat sink 310, and a top of the conductive through via 260.

The electromagnetic shield 500 may contact the at least one electromagnetic shielding terminal 126. For example, the electromagnetic shield 500 may contact the at least one electromagnetic shielding terminal 126 at a side surface of the package base substrate 100a.

The semiconductor package 1b may further include a plurality of external connection terminals 600. The plurality of external connection terminals 600 may be attached on the plurality of second connection pads 124 on the bottom of the package base substrate 100a.

In the semiconductor package 1b according to an embodiment, heat occurring in the semiconductor package 1b (e.g., heat occurring in the semiconductor chip 210) may be effectively dissipated to the outside by the heat sink 310 including the top that is exposed without being covered by the molding 400. The plurality of protrusion patterns 314 formed by filling a metal material into a through hole of an anodically oxidized aluminum oxide layer may be on the top of the heat sink 310, and thus, a surface area of the heat sink 310 may increase. Accordingly, heat dissipation efficiency may increase without any increase in volume of the semiconductor package 1b or area of the top of the semiconductor package 1b.

The plurality of protrusion patterns 314 included in the heat sink 310 may be on approximately the same level as an uppermost end of the molding 400. Therefore, the plurality of protrusion patterns 314 may not protrude to a level that is higher than the top of the molding 400, thereby preventing the plurality of protrusion patterns 314 from being damaged.

In an implementation, the semiconductor package 1*b* may further include the conductive through via 260 connecting the package base substrate 100*a* to the heat sink 310, heat occurring in the package base substrate 100*a* and/or heat transferred from the semiconductor chip 210 to the package base substrate 100*a* may be transferred to the heat sink 310, and thus, may be effectively dissipated to the outside.

In an implementation, in the semiconductor package 1*b*, the electromagnetic shield 500 may form an embossing pattern on the heat sink 310 where the plurality of protrusion patterns 314 are disposed, and thus, may efficiently absorb an electromagnetic wave radiated from the inside of the semiconductor package 1*b* to the top of the semiconductor package 1*b*, thereby preventing the electromagnetic wave from being radiated to the outside of the semiconductor package 1*b*.

Figure 4:
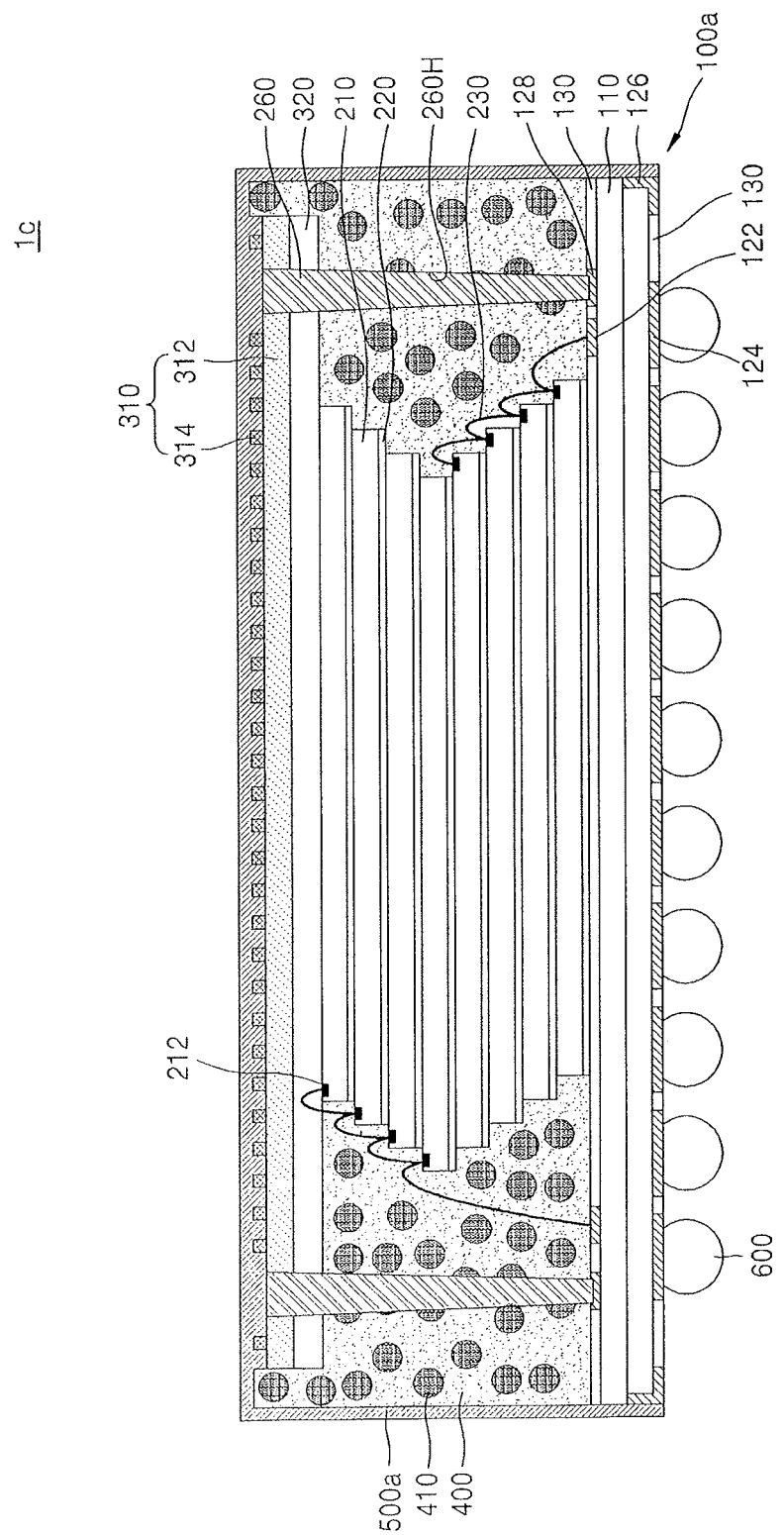
FIG. 4 illustrates a cross-sectional view of a semiconductor package according to an embodiment.

FIG. 4 illustrates a cross-sectional view of a semiconductor package 1*c* according to an embodiment. In describing FIG. 4, descriptions overlapping descriptions given above with reference to FIG. 1 may be omitted.

Referring to FIG. 4, the semiconductor package 1*c* may include a package base substrate 100, a semiconductor chip 210, and a heat sink 310. At least one semiconductor chip 210 may be mounted on the package base substrate 100. The heat sink 310 may be attached on the semiconductor chip 210. The heat sink 310 may be attached on the semiconductor chip 210 with a heat sink attach film 320 therebetween. The heat sink 310 may include a base 312 and a plurality of protrusion patterns 314 on the base 312. The plurality of protrusion patterns 314 may be on a top of the base 312 in a honeycomb structure. Each of the plurality of protrusion patterns 314 may have a circular horizontal cross-sectional shape.

The semiconductor package 1*c* may further include a molding 400. The molding 400 may include a filler 410.

An electromagnetic shield 500*a* may be provided on a surface of the semiconductor package 1*c*. The electromagnetic shield 500*a* may cover all of a surface of the semiconductor package 1*c* except a bottom of the semiconductor package 1*c*. For example, the electromagnetic shield 500*a* may cover a side surface of the package base substrate 100, a side surface and a top of the molding 400, and a surface of the heat sink 310. The electromagnetic shield 500*a* may contact at least one electromagnetic shielding terminal 126.

The electromagnetic shield 500*a* may include a top that fills a space between the plurality of protrusion patterns 314 on the heat sink 310 where the plurality of protrusion patterns 314 are disposed, and may be substantially flat on the top of the semiconductor package 1*c*. In a case where the electromagnetic shield 500*a* has a thickness that is relatively greater than a vertical height of each of the plurality of protrusion patterns 314 and an interval between the plurality of protrusion patterns 314, the electromagnetic shield 500*a* may include the flat top on the heat sink 310.

The semiconductor package 1*c* may further include a plurality of external connection terminals 600.

In the semiconductor package 1*c* according to an embodiment, heat occurring in the semiconductor package 1*c* (e.g., heat occurring in the semiconductor chip 210) may be effectively dissipated to the outside by the heat sink 310 including the top that is exposed without being covered by the molding 400. The plurality of protrusion patterns 314 formed by filling a metal material into a through hole of an anodically oxidized aluminum oxide layer may be on the top of the heat sink 310, and thus, a surface area of the heat sink 310 may increase. Accordingly, heat dissipation efficiency may increase without any increase in volume of the semiconductor package 1*c* or area of the top of the semiconductor package 1*c*.

The plurality of protrusion patterns 314 included in the heat sink 310 may be on approximately the same level as an uppermost end of the molding 400 and may be covered by the electromagnetic shield 500*a* having the flat top. Therefore, the semiconductor package 1*c* according to an embodiment may include a flat top, thereby preventing the plurality of protrusion patterns 314 from being damaged.

In an implementation, in the semiconductor package 1*c*, the electromagnetic shield 500*a* may effectively absorb an electromagnetic wave radiated from the inside of the semiconductor package 1*c*, thereby preventing the electromagnetic wave from being radiated to the outside of the semiconductor package 1*c*.

Figure 5:
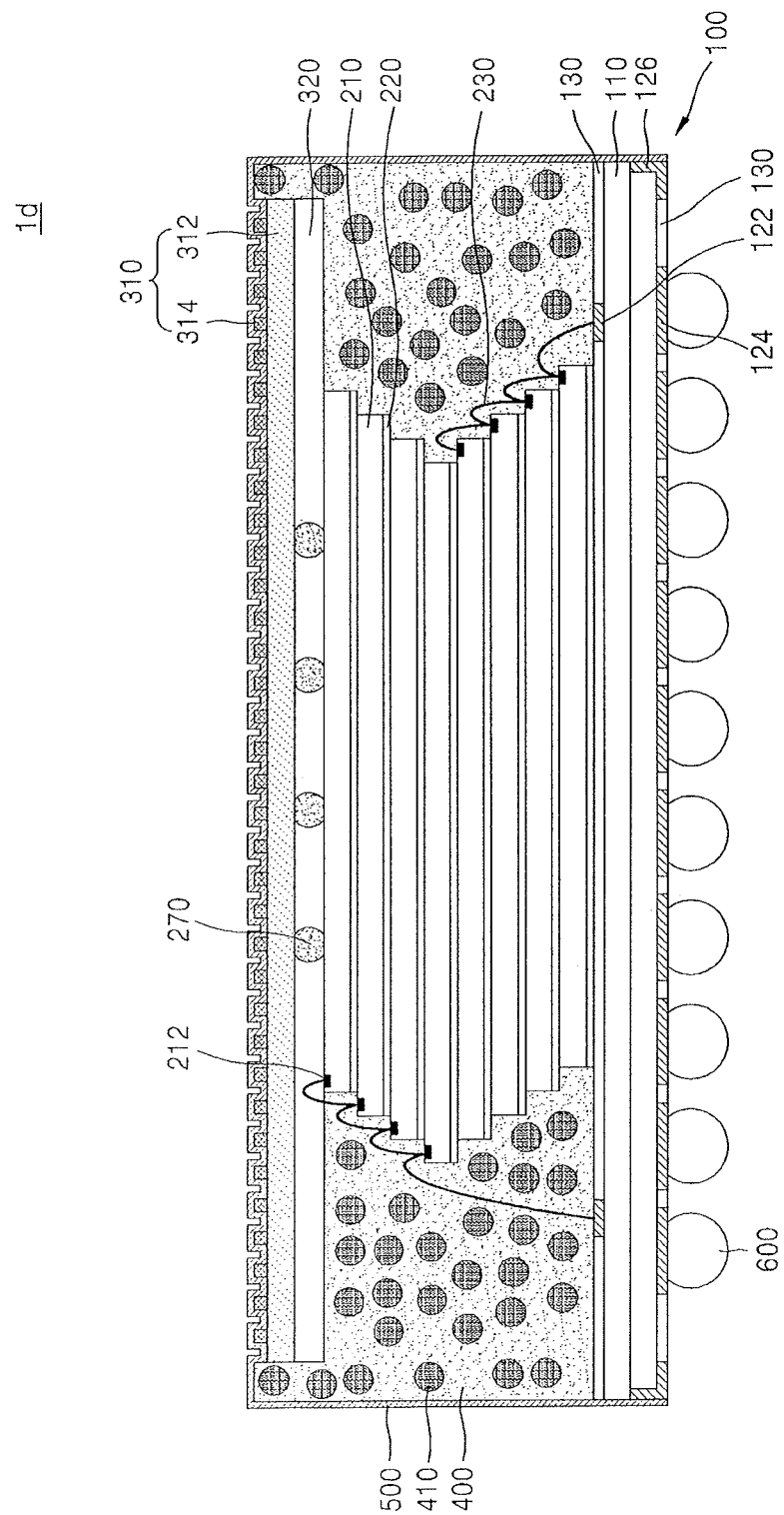
FIG. 5 illustrates a cross-sectional view of a semiconductor package according to an embodiment.

FIG. 5 illustrates a cross-sectional view of a semiconductor package 1*d* according to an embodiment. In describing FIG. 5, descriptions overlapping descriptions given above with reference to FIG. 1 may be omitted.

Referring to FIG. 5, the semiconductor package 1*d* may include a package base substrate 100, a semiconductor chip 210, and a heat sink 310. At least one semiconductor chip 210 may be mounted on the package base substrate 100. A plurality of conductive bumps 270 may be on the package base substrate 100. If the semiconductor package 1*d* includes a plurality of the semiconductor chips 210, the plurality of conductive bumps 270 may be on a semiconductor chip 210, located at an uppermost stage, of the plurality of semiconductor chips 210. A thickness of each of the plurality of conductive bumps 270 may be approximately the same as that of a below-described heat sink attach film 320.

The heat sink 310 may be attached on the semiconductor chip 210. The heat sink 310 may be attached on the semiconductor chip 210 with the heat sink attach film 320 therebetween. The plurality of conductive bumps 270 may pass through the heat sink attach film 320 and may connect a top of the semiconductor chip 210 to a bottom of the heat sink 310.

The heat sink 310 may include a base 312 and a plurality of protrusion patterns 314 on the base 312. The plurality of protrusion patterns 314 may be on a top of the base 312 in a honeycomb structure. Each of the plurality of protrusion patterns 314 may have a circular horizontal cross-sectional shape.

The semiconductor package 1*d* may further include a molding 400. The molding 400 may include a filler 410.

An electromagnetic shield 500 may be provided on a surface of the semiconductor package 1*d*. The electromagnetic shield 500 may cover all of a surface of the semiconductor package 1*d* except a bottom of the semiconductor package 1*d*. For example, the electromagnetic shield 500 may cover a side surface of the package base substrate 100, a side surface and a top of the molding 400, and a surface of the heat sink 310. The electromagnetic shield 500 may contact at least one electromagnetic shielding terminal 126.

The semiconductor package 1*d* may further include a plurality of external connection terminals 600.

In the semiconductor package 1*d* according to an embodiment, heat occurring in the semiconductor package 1*d* (e.g., heat occurring in the semiconductor chip 210) may be effectively dissipated to the outside by the heat sink 310 including the top that is exposed without being covered by the molding 400. The plurality of protrusion patterns 314 formed by filling a metal material into a through hole of an anodically oxidized aluminum oxide layer may be on the top of the heat sink 310, and thus, a surface area of the heat sink 310 may increase. Accordingly, heat dissipation efficiency may increase without any increase in volume of the semiconductor package 1*d* or area of the top of the semiconductor package 1*d*.

The plurality of protrusion patterns 314 included in the heat sink 310 may be on approximately the same level as an uppermost end of the molding 400. Therefore, the plurality of protrusion patterns 314 may not protrude to a level that is higher than the top of the molding 400, thereby preventing the plurality of protrusion patterns 314 from being damaged.

In an implementation, the semiconductor package 1*d* may further include the conductive bumps 270 that connect the semiconductor chip 210 to the heat sink 310, heat occurring in the semiconductor chip 210 may be quickly transferred to the heat sink 310, and thus, may be effectively dissipated to the outside.

In an implementation, in the semiconductor package 1*d*, the electromagnetic shield 500 may effectively absorb an electromagnetic wave radiated from the inside of the semiconductor package 1*d*, thereby preventing the electromagnetic wave from being radiated to the outside of the semiconductor package 1*d*.

In the present specification, the conductive ball pillar 250 of FIG. 2, the conductive through via 260 of FIG. 3, and the conductive bump 270 of FIG. 5 contacting the heat sink 310 may be referred to as a conductive heat dissipation terminal.

Figure 8:
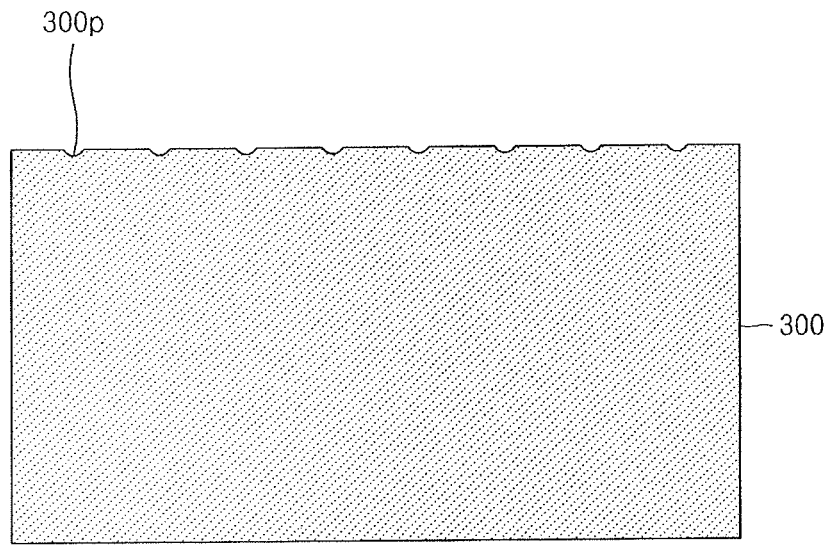
Figure 9:
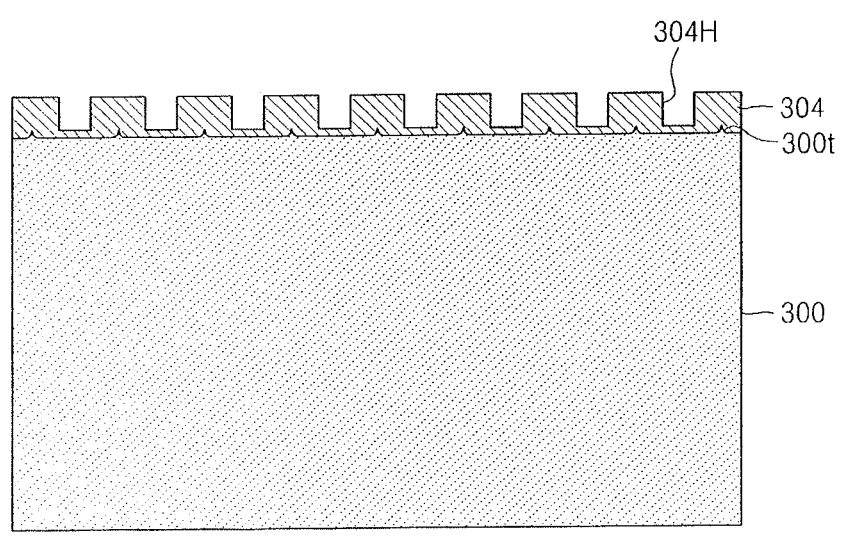
Figure 10A:
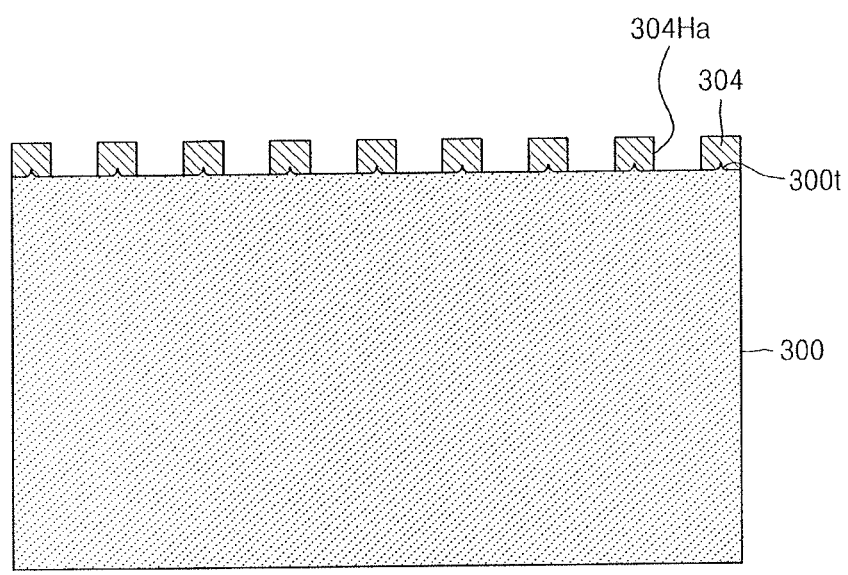
Figure 10B:
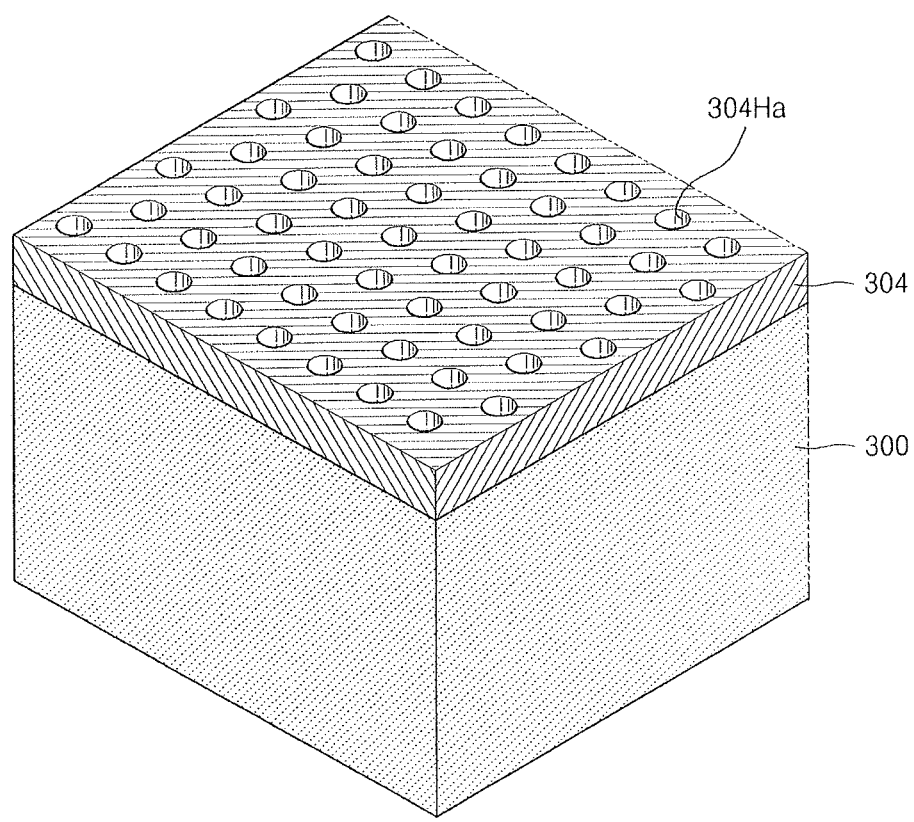
FIG. 10B illustrates a perspective view of FIG. 10A.

FIGS. 6 to 10A and 11 illustrate cross-sectional views of stages in a process of manufacturing a heat sink according to an embodiment, and FIG. 10B illustrates a perspective view of FIG. 10A. In FIGS. 6 to 11, a portion of the heat sink is enlarged and illustrated.

Figure 6:
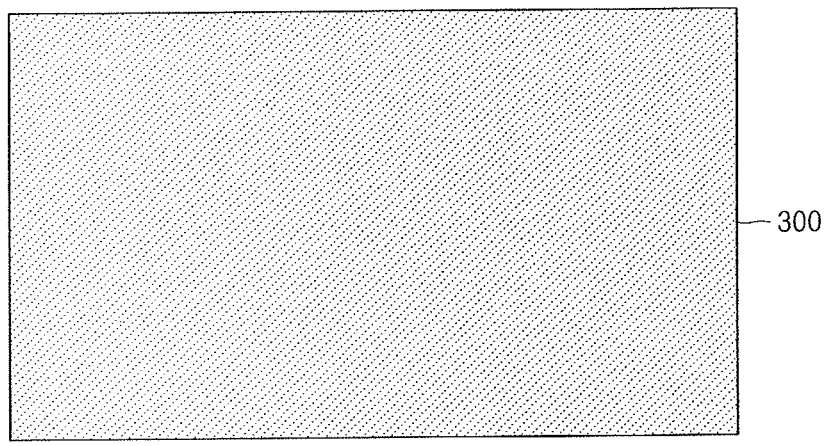

Referring to FIG. 6, a metal base 300 may be provided. The metal base 300 may have, e.g., a thickness of tens of microns. The metal base 300 may include, e.g., Al. alternatively, the metal base 300 may be an aluminum layer formed on a metal substrate that is good in thermal conductivity.

Figure 7:
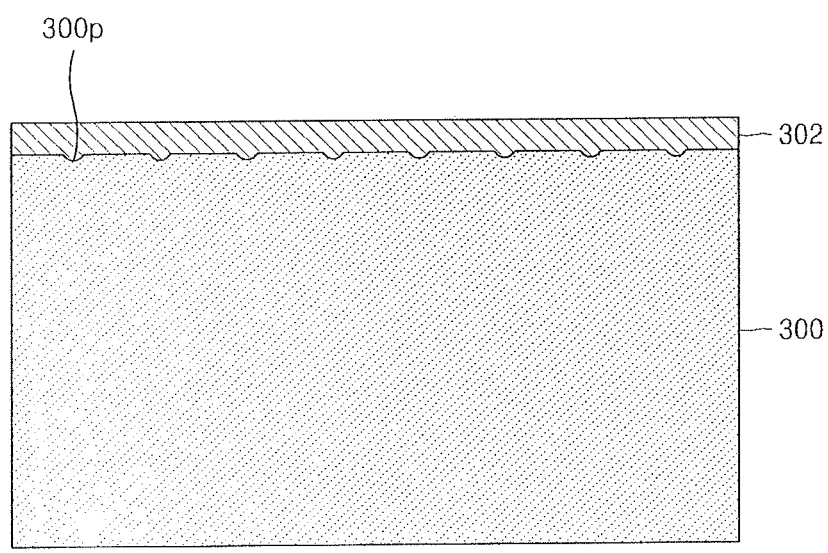

Referring to FIG. 7, primary anodic oxidation may be performed on the metal base 300. In the primary anodic oxidation, the metal base 300 may be dipped into an anodizing solution, and then, a certain voltage may be applied. The primary anodic oxidation may be performed through, e.g., anodic oxidation where a voltage of 40 V is applied for five minutes in a sulfuric acid solution of about 0.3 M having a temperature of 11° C.

A portion of an upper side of the metal base 300 may be formed as a preliminary anodic oxidation aluminum oxide layer 302 through the primary anodic oxidation. A plurality of nano pores 300*p* may be formed on a remaining surface of the metal base 300. The plurality of nano pores 300*p* may be formed when the anodizing solution is relatively much supplied to a path or a flow occurring in a top of the metal base 300 in the primary anodic oxidation, and through an anodic oxidation process of applying a certain voltage, the plurality of nano pores 300*p* may be self-organized and may have a relatively high regularity. For example, the plurality of nano pores 300*p* may be formed in a honeycomb structure.

In an implementation, in order to more increase a regularity of the plurality of nano pores 300*p*, surface treatment may be performed on the top of the metal base 300 before performing the primary anodic oxidation, and thus, the nano pores 300*p* may be arranged to have a high regularity. The surface treatment may be, e.g., a process where grooves are arranged to have a regularity on the top of the metal base 300 by performing an etching process using a mask including a plurality of through holes which are arranged to have a regularity.

Referring to FIG. 8, the preliminary anodic oxidation aluminum oxide layer (302 of FIG. 7) on the metal base 300 may be removed. The preliminary anodic oxidation aluminum oxide layer 302 may be removed by using, e.g., a mixed solution of chromic acid and phosphoric acid.

Referring to FIG. 9, an anodic oxidation aluminum oxide layer 304 including a plurality of blind holes 304H may be formed on the metal base 300 by performing secondary anodic oxidation on the metal base 300. In the secondary anodic oxidation, the metal base 300 may be dipped into an anodizing solution, and then, a certain voltage may be applied. The secondary anodic oxidation may be performed through, for example, anodic oxidation where a voltage of 40 V is applied for twenty minutes in a sulfuric acid solution of about 0.3 M having a temperature of 11° C.

In an implementation, the primary anodic oxidation and second anodic oxidation conditions (i.e., a temperature of the anodizing solution, an applied voltage, a voltage application time for which the voltage is applied, and the anodizing solution) may be performed as described above with reference to FIGS. 7 and 9. In an implementation, voltage application time may be longer in the secondary anodic oxidation than the primary anodic oxidation.

The plurality of blind holes 304H may extend from a top to the inside of the anodic oxidation aluminum oxide layer 304. The plurality of blind holes 304H may be formed at respective positions corresponding to the plurality of nano pores (300*p* of FIG. 8). The plurality of blind holes 304H may be regularly arranged to have a diameter of about several nm to tens of nm. The plurality of blind holes 304H may be formed to have a depth of about several nm to tens of nm. The plurality of blind holes 304H may be arranged to have a honeycomb structure.

A diameter of each of the plurality of blind holes 304H may be controlled by selecting a temperature of an anodizing solution, an applied voltage, and the kind of the anodizing solution (electrolyte acid) when performing an anodic oxidation process. The plurality of blind holes 304H may each have, e.g., a diameter of several nm to tens of nm.

A protrusion 300*t* may be formed on the top of the metal base 300 between the plurality of blind holes 304H. The protrusion 300*t* may be formed when the secondary anodic oxidation is relatively less performed at an upper portion of the metal base 300 near the plurality of blind holes 304H.

Referring to FIGS. 10A and 10B, by removing a portion of the anodic oxidation aluminum oxide layer 304, the plurality of blind holes (304H of FIG. 9) may expand, and thus, a plurality of through holes 304Ha extending from a top to a bottom of the anodic oxidation aluminum oxide layer 304 may be formed. The metal base 300 may be exposed at a bottom of each of the plurality of through holes 304Ha. The plurality of through holes 304Ha may be arranged to have, e.g., a honeycomb structure.

In order to form the plurality of through holes 304Ha, a height of the anodic oxidation aluminum oxide layer 304 may be slightly reduced in a process of removing a portion of the anodic oxidation aluminum oxide layer 304.

Figure 11:
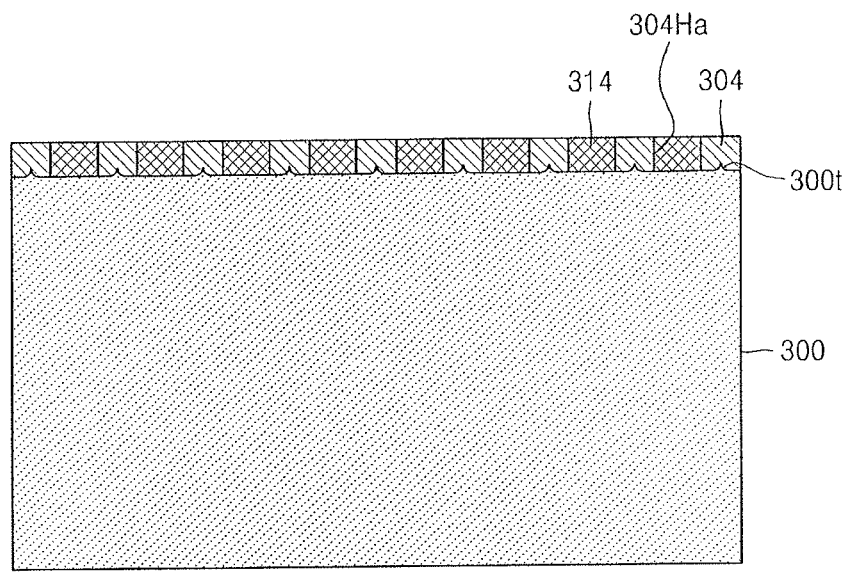

Referring to FIG. 11, a plurality of protrusion patterns 314 may be formed by filling a metal material into the plurality of through holes 304Ha. The plurality of protrusion patterns 314 may include, e.g., Al or Cu. The plurality of protrusion patterns 314 may be formed through a plating process by using, as a seed, a top portion of the metal base 300 exposed at the bottom of each of the plurality of through holes 304Ha. For example, the plurality of protrusion patterns 314 may be formed by an immersion plating process, an electroless plating process, an electroplating process, or a combination thereof. In some embodiments, a metal paste may be filled into the plurality of through holes 304Ha, and then, by curing the metal paste, the plurality of protrusion patterns 314 may be formed.

Figure 12A:
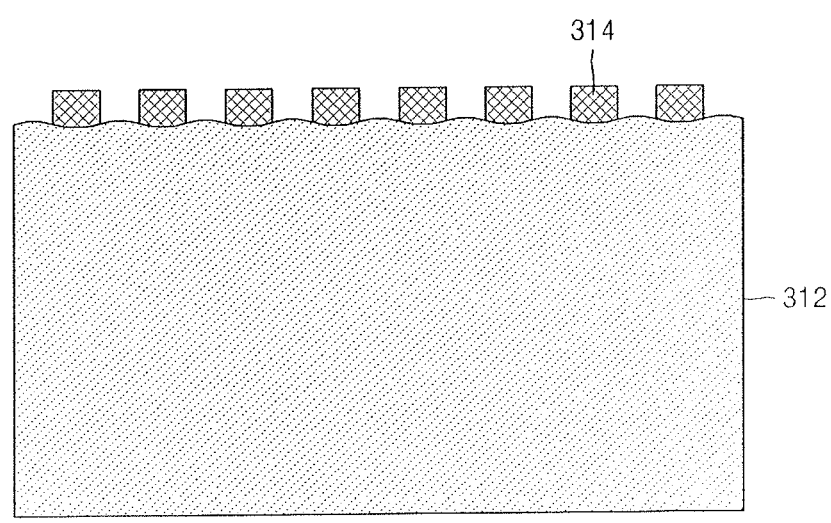
FIGS. 12A and 12B illustrate a cross-sectional view and a perspective view of a heat sink according to an embodiment.
Figure 12B:
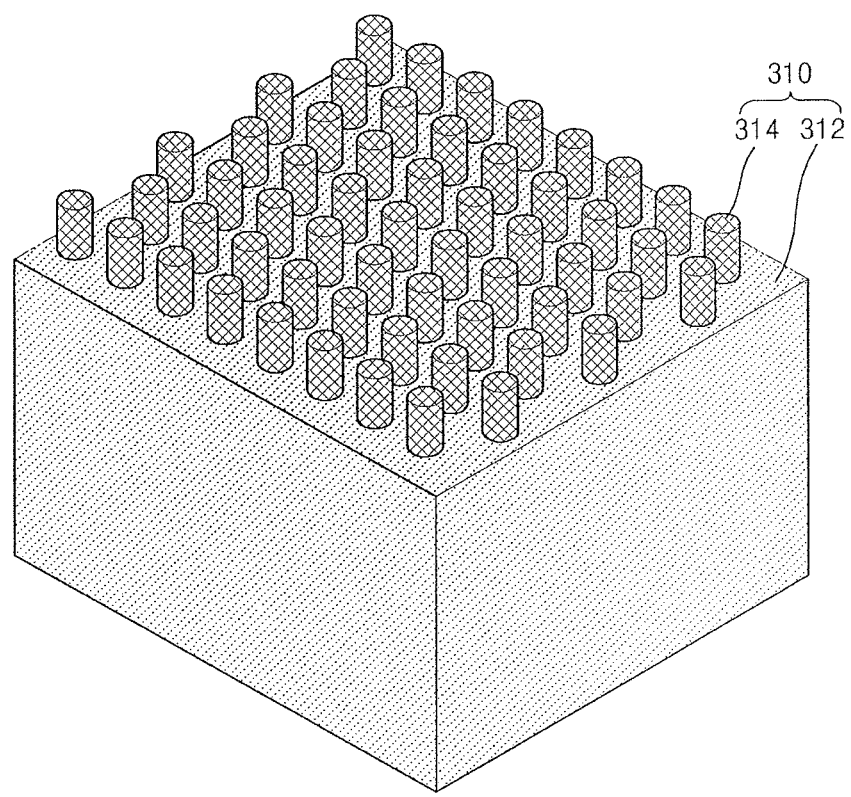

FIGS. 12A and 12B illustrate a cross-sectional view and a perspective view of a heat sink according to an embodiment.

Referring to FIGS. 12A and 12B, a heat sink 310 including a base 312 and a plurality of protrusion patterns 314 on a top of the base 312 may be formed by removing an anodic oxidation aluminum oxide layer (304 of FIG. 11) from a resultant material of FIG. 11.

The anodic oxidation aluminum oxide layer 304 may be removed through wet etching. For example, the anodic oxidation aluminum oxide layer 304 may be removed by a wet etching process using an acidic solution such as a mixed solution of $CuCl_2$ and $H_3PO_4$.

The base 312 may be the metal base 300 shown in FIG. 11. In an implementation, the base 312 may be a portion of the metal base 300 that remains after a portion of an upper side of the metal base 300 is removed in a process of removing the anodic oxidation aluminum oxide layer 304 on the metal base 300 shown in FIG. 11.

FIGS. 13 to 16 illustrate cross-sectional views of stages in a process of manufacturing a semiconductor package according to an embodiment. For example, FIGS. 13 to 16 illustrate cross-sectional views of stages in a process of manufacturing the semiconductor package 1 shown in FIG. 1.

Figure 13:
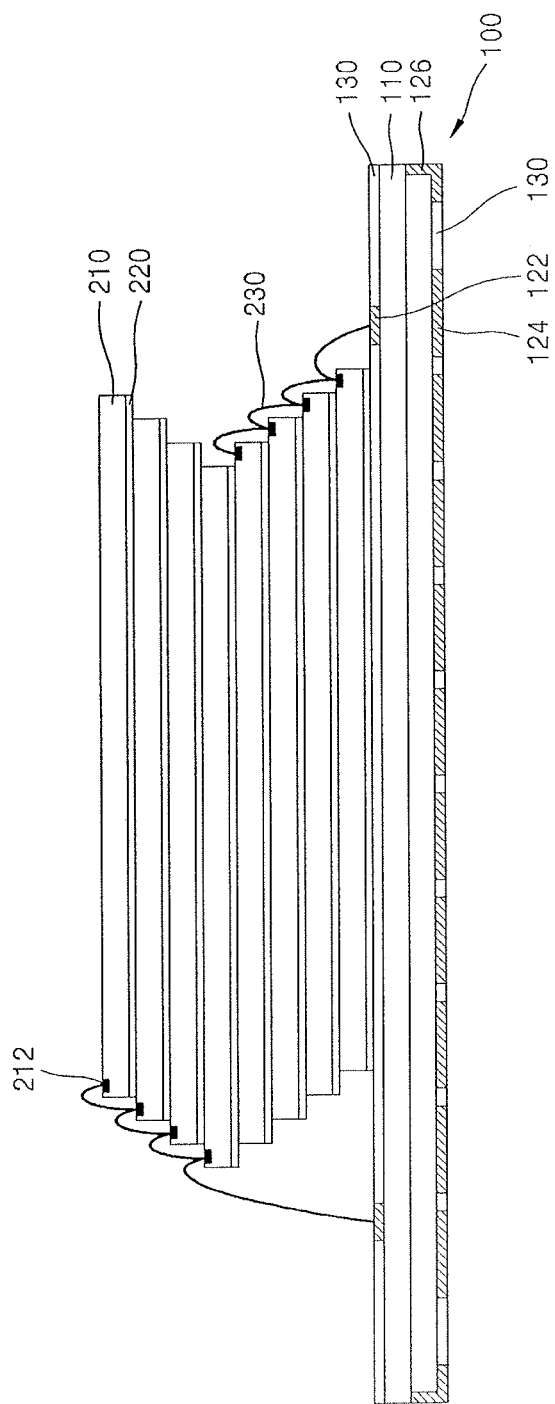
FIGS. 13 to 16 illustrate cross-sectional views of stages in a process of manufacturing a semiconductor package according to an embodiment.

Referring to FIG. 13, a package base substrate 100 may be provided, and then, a semiconductor chip 210 may be attached on the package base substrate 100. In an implementation, the semiconductor chip 210 may be attached on the package base substrate 100 by using a die attach film 220 attached on a bottom (i.e., an inactive surface) thereof. In an implementation, at least one semiconductor chip pad 212 may be on a top (i.e., an active surface) of the semiconductor chip 210.

In an implementation, a plurality of the semiconductor chips 210 each including a bottom attached on the die attach film 220 may be sequentially stacked in a stepped form on the package base substrate 100. In this case, each of the plurality of semiconductor chips 210 may be stacked not to cover a semiconductor chip pad 212 included in a semiconductor chip 210 thereunder. Subsequently, a bonding wire 230 that connects the semiconductor chip pad 212 of the semiconductor chip 210 to a first connection pad 122 of the package base substrate 100 may be formed.

Figure 14:
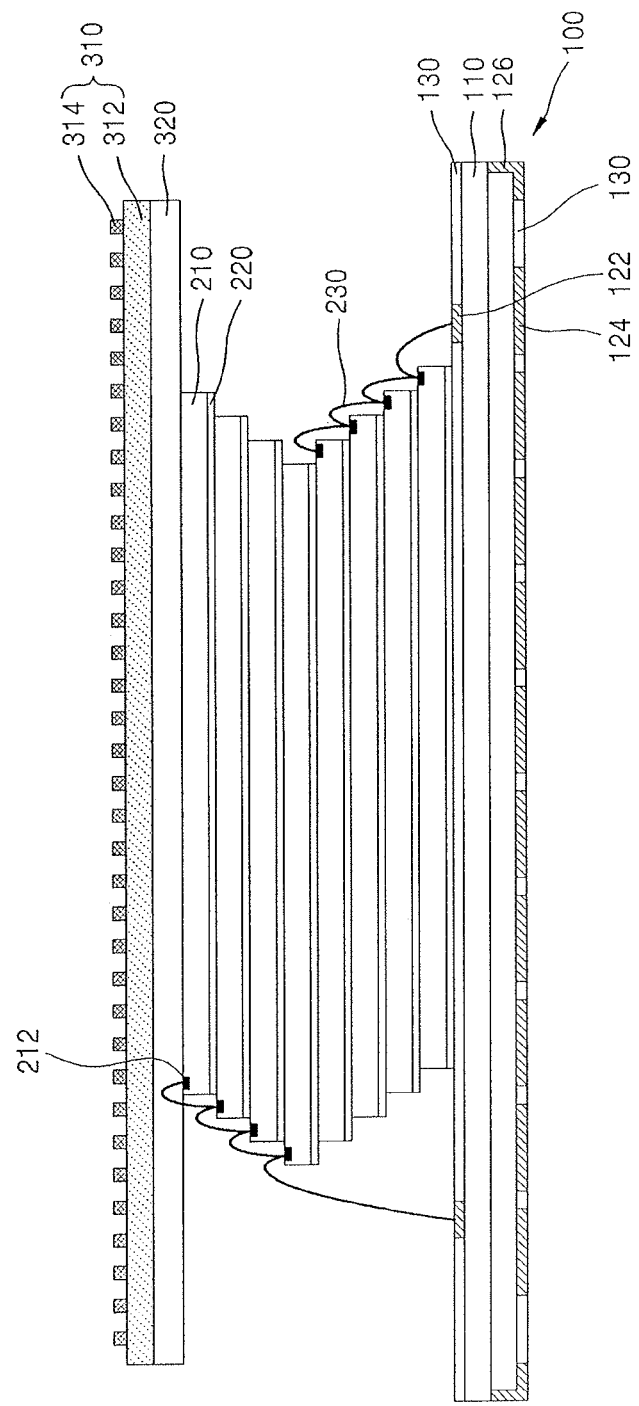

Referring to FIG. 14, a heat sink 310 including a bottom attached on a heat sink attach film 320 may be attached on the semiconductor chip 210. A portion of the bonding wire 230 connected to the semiconductor chip pad 212 of the semiconductor chip 210 may be buried in the heat sink attach film 320.

If the plurality of semiconductor chips 210 are stacked on the package base substrate 100, the heat sink 310 may be attached on a semiconductor chip 210, located at an uppermost stage, of the plurality of semiconductor chips 210, and a portion of the bonding wire 230 connected to a semiconductor chip pad 212 of the uppermost-stage semiconductor chip 210 may be buried in the heat sink attach film 320.

The heat sink attach film 320 may be attached on a bottom of each of a plurality of heat sinks 310 provided as one body, and then, by separating each of the plurality of heat sinks 310 into an individual heat sink 310, the heat sink 310 may be formed. Therefore, the heat sink attach film 320 may have a horizontal area that is approximately the same as that of the heat sink 310, so as to cover a bottom of the heat sink 310.

A horizontal area of the heat sink 310 may be less than that of the package base substrate 100, and may be greater than that of the semiconductor chip 210.

Figure 15:
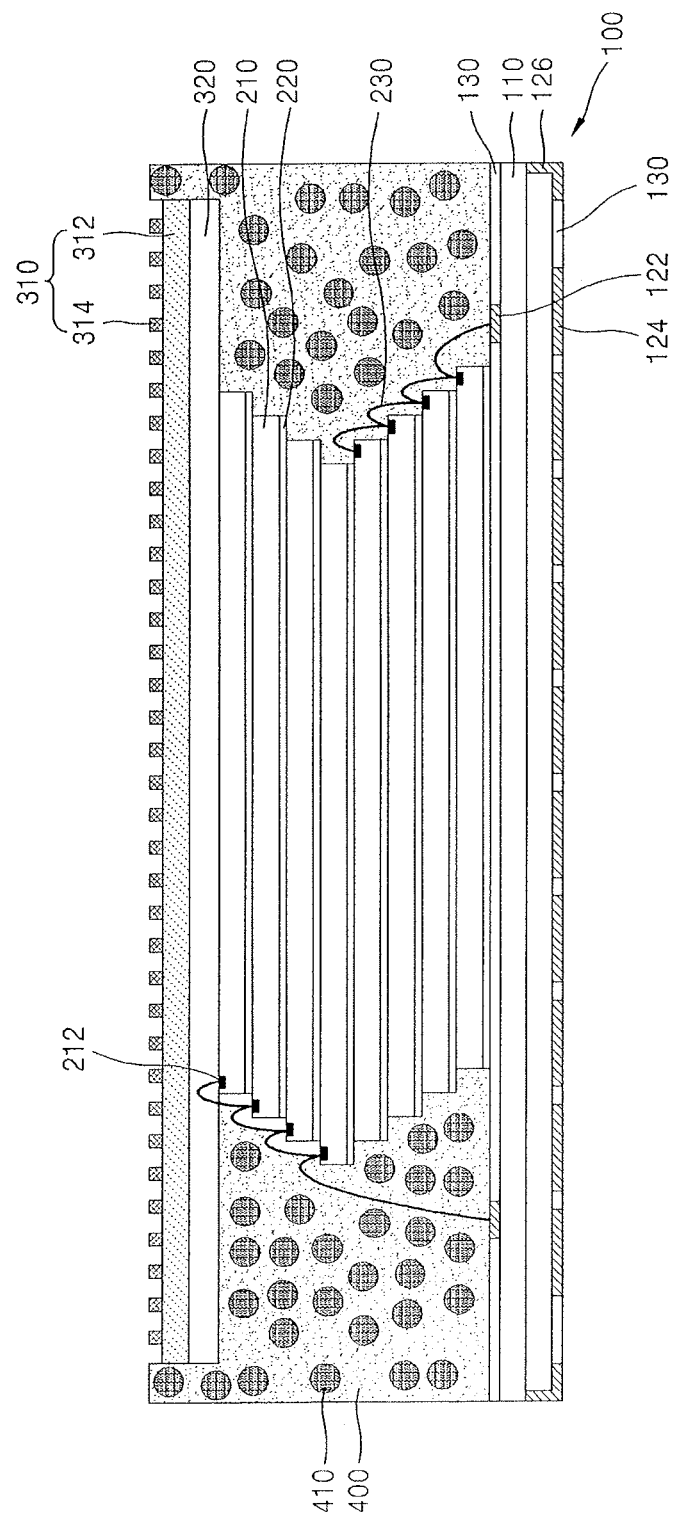

Referring to FIG. 15, a molding 400 may be formed on the package base substrate 100 to surround the semiconductor chip 210, the bonding wire 230, and the heat sink 310. The molding 400 may cover, e.g., a top of the package base substrate 100, a side surface of the semiconductor chip 210, and a side surface of the heat sink 310. The molding 400 may be formed as an exposed-type mold that does not cover a top of the heat sink 310.

The molding 400 may be formed so that an uppermost end of the molding 400 is on approximately the same level as an uppermost end of the heat sink 310. For example, the molding 400 may be formed so that the uppermost end of the molding 400 is on the same level as a top of each of the plurality of protrusion patterns 314 of the heat sink 310.

A diameter of a filler 410 included in the molding 400 may be greater than an interval between the plurality of protrusion patterns 314, and in a process of forming the molding 400, the filler 410 may plug a gap between the plurality of protrusion patterns 314 adjacent to an edge of a top of the heat sink 310. Accordingly, the molding 400 may not cover the top of the heat sink 310.

Figure 16:
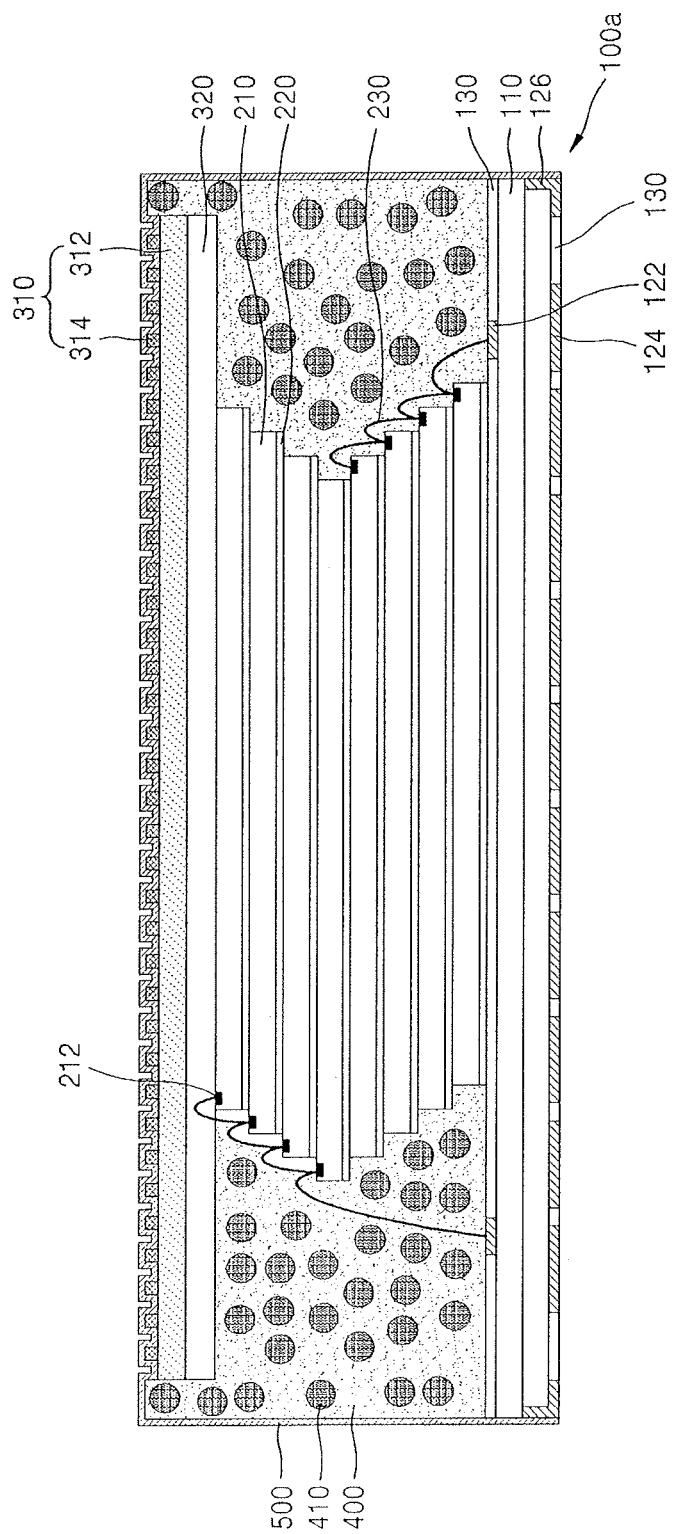

Referring to FIG. 16, an electromagnetic shield 500 that covers a side surface of the package base substrate 100, a side surface and a top of the molding 400, and a surface of the heat sink 310 may be formed. The electromagnetic shield 500 may be formed in a conformal shielding manner. The electromagnetic shield 500 may be formed by, e.g., a physical vapor deposition (PVD) process, a film attach process, or an electroless plating process.

The electromagnetic shield 500 may contact at least one electromagnetic shielding terminal 126. The electromagnetic shield 500 may cover all of a surface of the package base substrate 100 except a bottom of the package base substrate 100.

In an implementation, the electromagnetic shield 500 may form an embossing pattern which is conformally formed along a side surface and a top of each of the plurality of protrusion patterns 314 and a surface of the base 312 between the plurality of protrusion patterns 314, on the heat sink 310 where the plurality of protrusion patterns 314 are disposed. In an implementation, the electromagnetic shield 500 may form the embossing pattern which fills a space between plurality of protrusion patterns 314 on the heat sink 310 where the plurality of protrusion patterns 314 are disposed and onto which a shape of the plurality of protrusion patterns 314 is transferred.

Subsequently, as shown in FIG. 1, the semiconductor package 1 may be formed by attaching a plurality of external connection terminals 600 on a plurality of second connection pads 124 disposed on the bottom of the package base substrate 100.

FIGS. 17 to 20 illustrate cross-sectional views of stages in a process of manufacturing a semiconductor package according to an embodiment. For example, FIGS. 17 to 20 illustrate cross-sectional views of stages in a process of manufacturing the semiconductor package 1a shown in FIG. 2.

Figure 17:
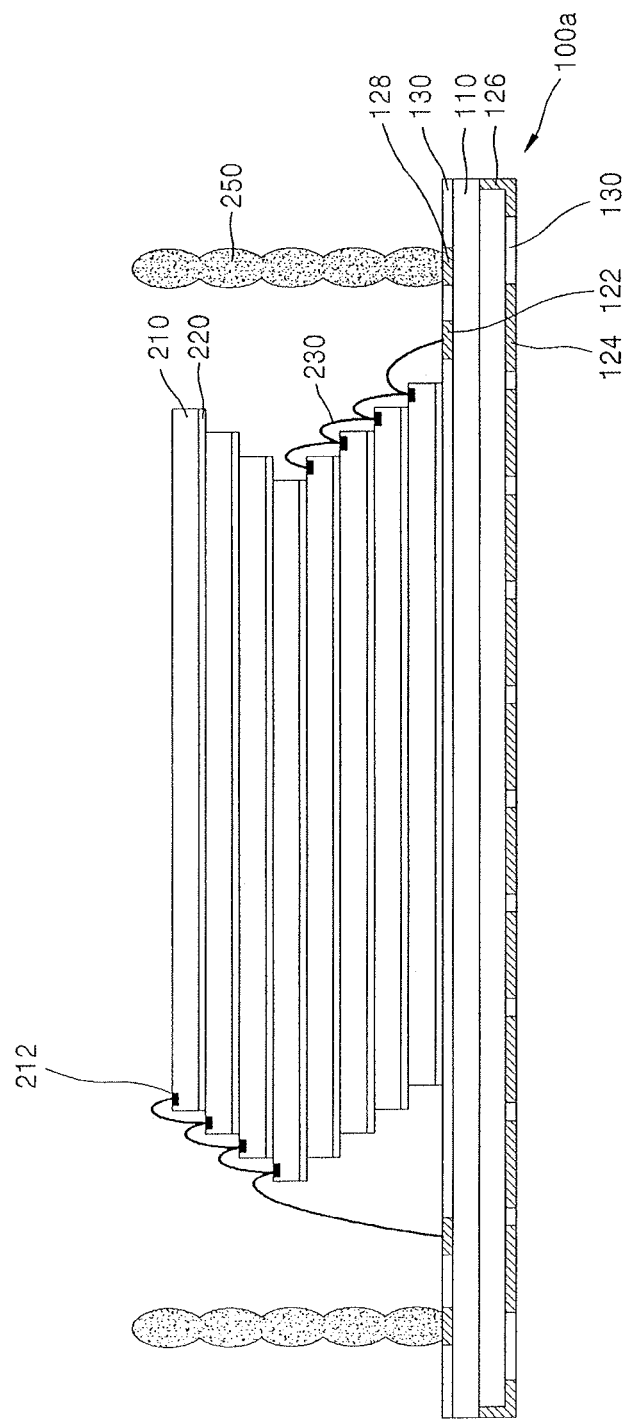
FIGS. 17 to 20 illustrate cross-sectional views of stages in a process of manufacturing a semiconductor package according to an embodiment.

Referring to FIG. 17, identically to description given above with reference to FIG. 13, a semiconductor chip 210 may be attached on a package base substrate 100a, and a bonding wire 230 that connects a semiconductor chip pad 212 of the semiconductor chip 210 to a first connection pad 122 of the package base substrate 100*a* may be formed.

Subsequently, a conductive ball pillar 250 may be formed on a top of the package base substrate 100*a*. The conductive ball pillar 250 may be formed, e.g., by vertically stacking a plurality of solder balls. The conductive ball pillar 250 may be formed so as to be attached on a heat transfer pad 128 on a top of the package base substrate 100*a*. The conductive ball pillar 250 may be formed so that an uppermost end of the conductive ball pillar 250 is on a level that is higher than an uppermost end of each of a plurality of the semiconductor chips 210 and an uppermost end of a bonding wire 230.

Figure 18:
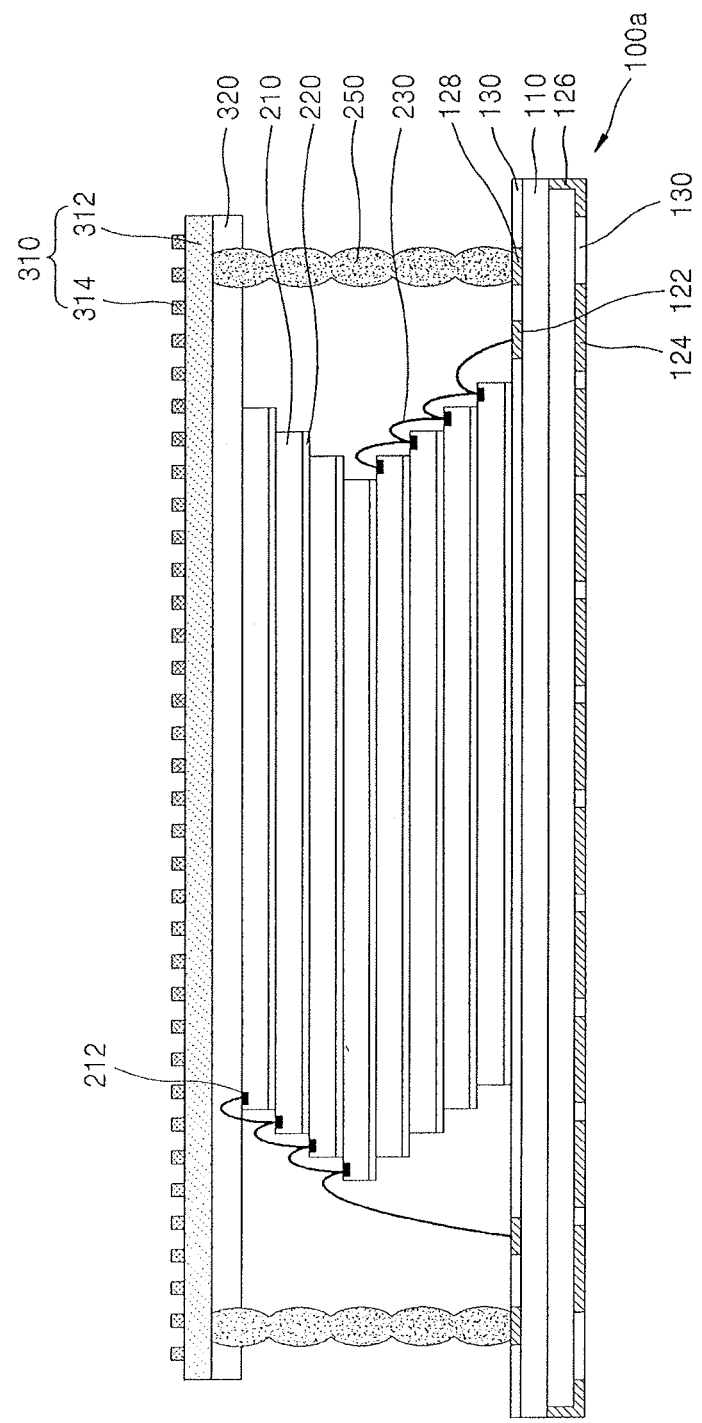

Referring to FIG. 18, a heat sink 310 including a bottom attached on a heat sink attach film 320 may be attached on the semiconductor chip 210. A portion of the bonding wire 230 connected to the semiconductor chip pad 212 of the semiconductor chip 210 may be buried in the heat sink attach film 320.

The heat sink 310 may be attached on the semiconductor chip 210 so that an upper portion of the conductive ball pillar 250 passes through the heat sink attach film 320 and contacts a bottom of a base 312 of the heat sink 310. To this end, the conductive ball pillar 250 may be formed so that an uppermost end of the conductive ball pillar 250 is on a level that is higher than the uppermost end of each of the plurality of semiconductor chips 210 by about a thickness of the heat sink attach film 320.

Figure 19:
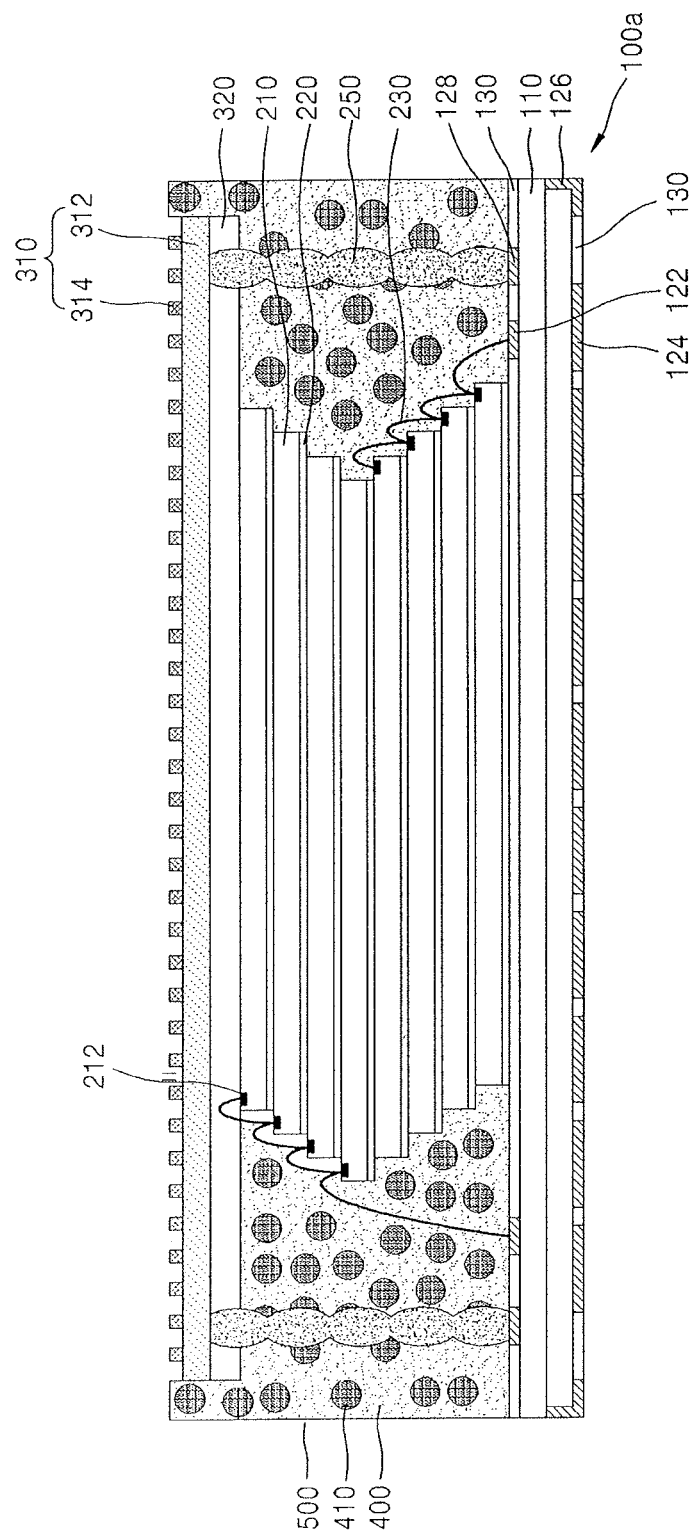

Referring to FIG. 19, a molding 400 may be formed on the package base substrate 100*a* to surround the semiconductor chip 210, the bonding wire 230, the conductive ball pillar 250, and the heat sink 310. The molding 400 may cover, e.g., a top of the package base substrate 100*a*, a side surface of the semiconductor chip 210, a side surface of the conductive ball pillar 250, and a side surface of the heat sink 310. The molding 400 may be formed as an exposed-type mold which does not cover the top of the heat sink 310.

The molding 400 may be formed so that an uppermost end of the molding 400 and an uppermost end of the heat sink 310 are on approximately the same level.

Figure 20:
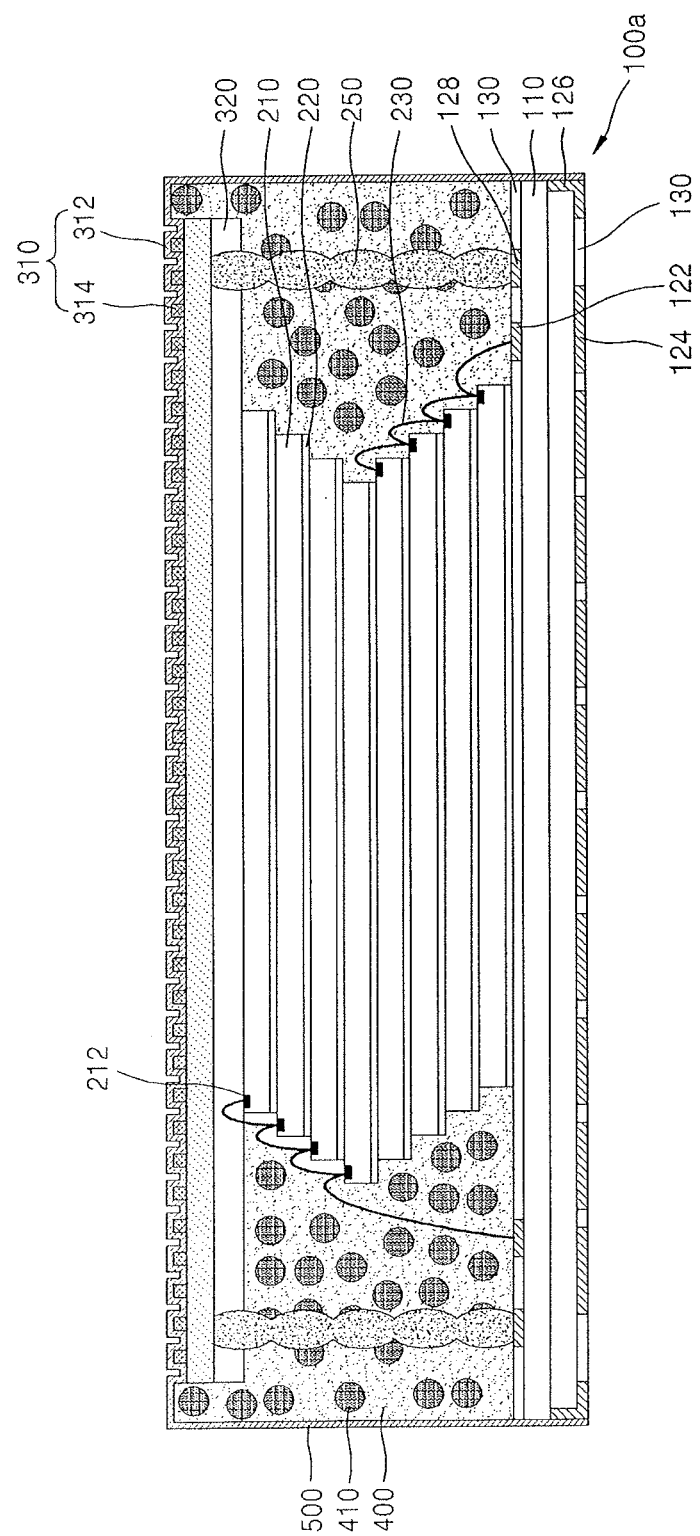

Referring to FIG. 20, an electromagnetic shield 500 that covers a side surface of the package base substrate 100*a*, a side surface and a top of the molding 400, and a surface of the heat sink 310 may be formed. The electromagnetic shield 500 may contact at least one electromagnetic shielding terminal 126. The electromagnetic shield 500 may cover all of a surface of the package base substrate 100*a* except a bottom of the package base substrate 100*a*.

Subsequently, as shown in FIG. 2, the semiconductor package 1*a* may be formed by attaching a plurality of external connection terminals 600 on a plurality of second connection pads 124 on the bottom of the package base substrate 100*a*.

Figure 21:
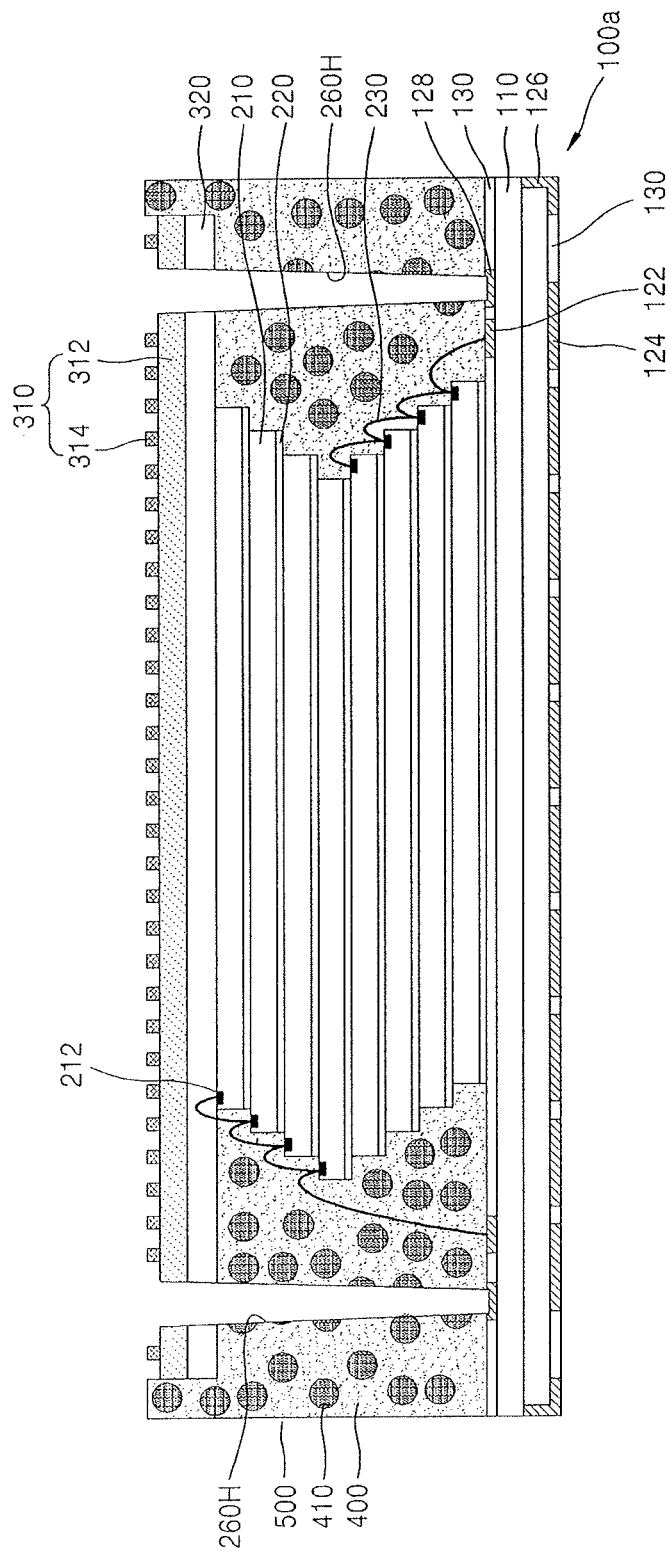
FIGS. 21 to 23 illustrate cross-sectional views of stages in a process of manufacturing a semiconductor package according to an embodiment.
Figure 22:
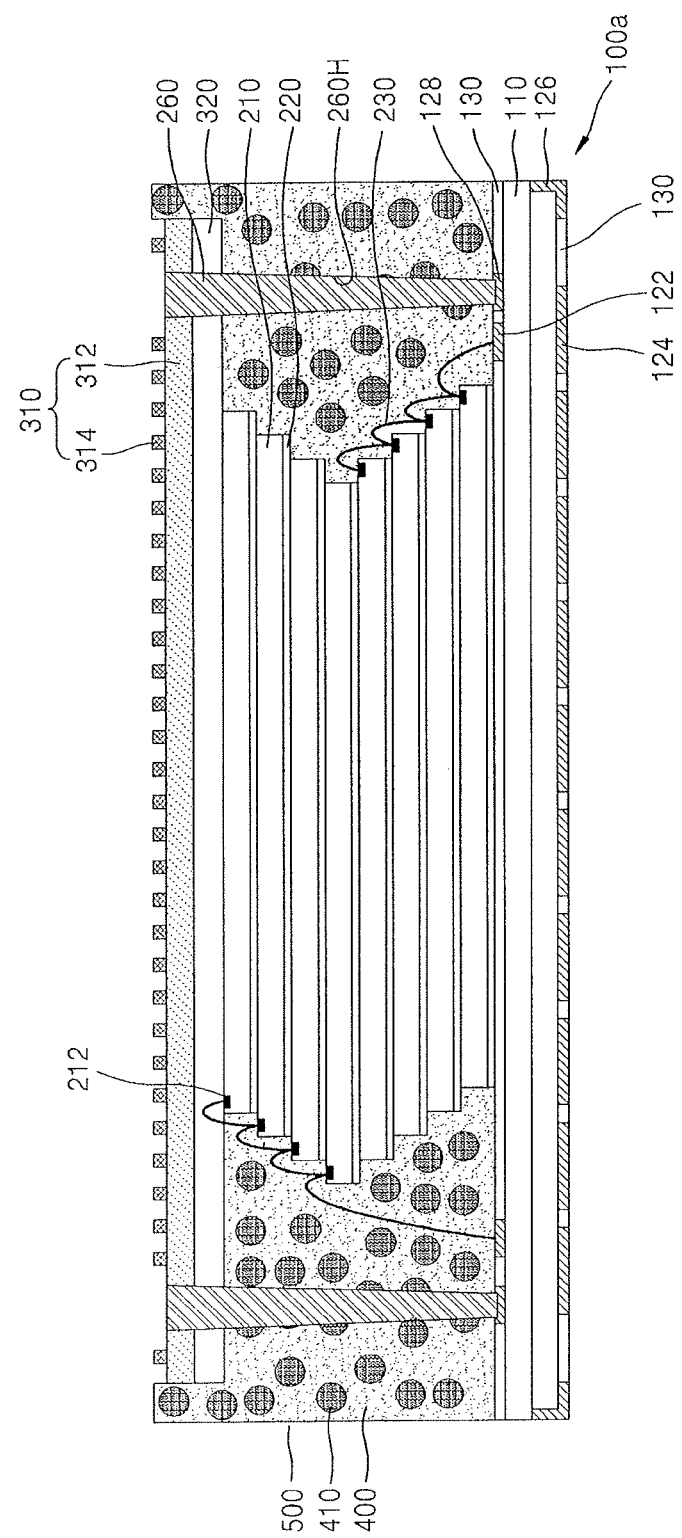
Figure 23:
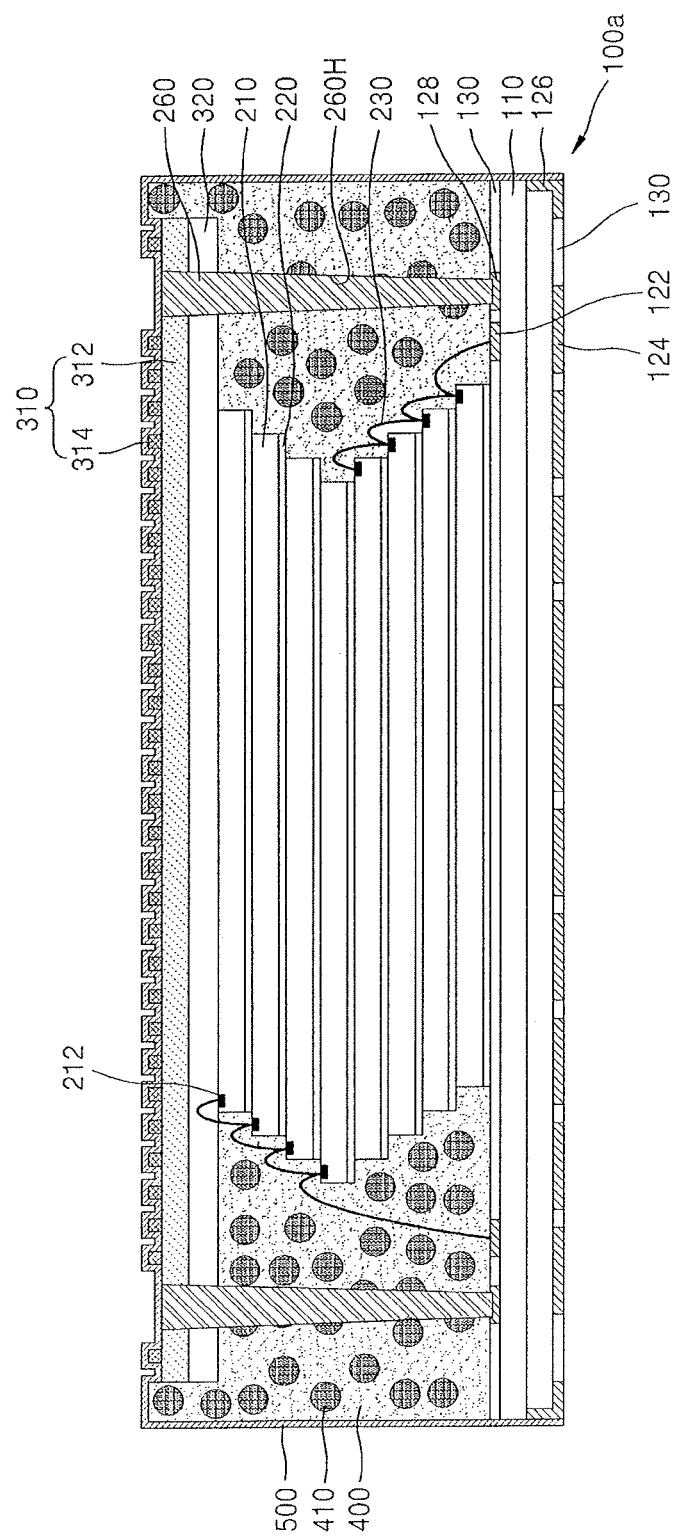

FIGS. 21 to 23 illustrate cross-sectional views of stages in a process of manufacturing a semiconductor package according to an embodiment. For example, FIGS. 21 to 23 illustrate cross-sectional views of stages in a process of manufacturing the semiconductor package 1*b* shown in FIG. 3.

Referring to FIG. 21, identically to descriptions given above with reference to FIGS. 13 to 15, a semiconductor chip 210 may be attached on a package base substrate 100*a*, and a bonding wire 230 that connects a semiconductor chip pad 212 of the semiconductor chip 210 to a first connection pad 122 of the package base substrate 100*a* may be formed. Also, a heat sink 310 including a bottom attached on a heat sink attach film 320 may be attached on the semiconductor chip 210, and a molding 400 may be formed on the package base substrate 100*a* to surround the semiconductor chip 210, the bonding wire 230, and the heat sink 310.

Subsequently, a through via hole 260H that passes through the heat sink 310, the heat sink attach film 320, and the molding 400 to expose a portion of a top of the package base substrate 100*a* may be formed. The through via hole 260H may be formed by, e.g., an etching process or a laser drilling process.

Referring to FIG. 22, a conductive through via 260 may be formed by filling a metal material into the through via hole 260H. A side surface of the conductive through via 260 may contact the heat sink 310, the heat sink attach film 320, and the molding 400, and a bottom of the conductive through via 260 may contact a heat transfer pad 128. A top of the conductive through via 260 may be exposed at a top of a base 312 of the heat sink 310. In an implementation, the top of the conductive through via 260 and the top of the base 312 of the heat sink 310 may be on approximately the same level.

The conductive through via 260 may be formed by filling the metal material into the through via hole 260H that is formed by removing a portion of the heat sink 310 so as to pass through the heat sink 310, and a protrusion pattern 314 may not be disposed on the top of the conductive through via 260.

Referring to FIG. 23, an electromagnetic shield 500 that covers a side surface of the package base substrate 100*a*, the top of the conductive through via 260, a side surface and a top of the molding 400, and a surface of the heat sink 310 may be formed. The electromagnetic shield 500 may contact at least one electromagnetic shielding terminal 126. The electromagnetic shield 500 may cover all of a surface of the package base substrate 100*a* except a bottom of the package base substrate 100*a*.

Subsequently, as shown in FIG. 3, the semiconductor package 1*b* may be formed by attaching a plurality of external connection terminals 600 on a plurality of second connection pads 124 on the bottom of the package base substrate 100*a*.

Figure 24:
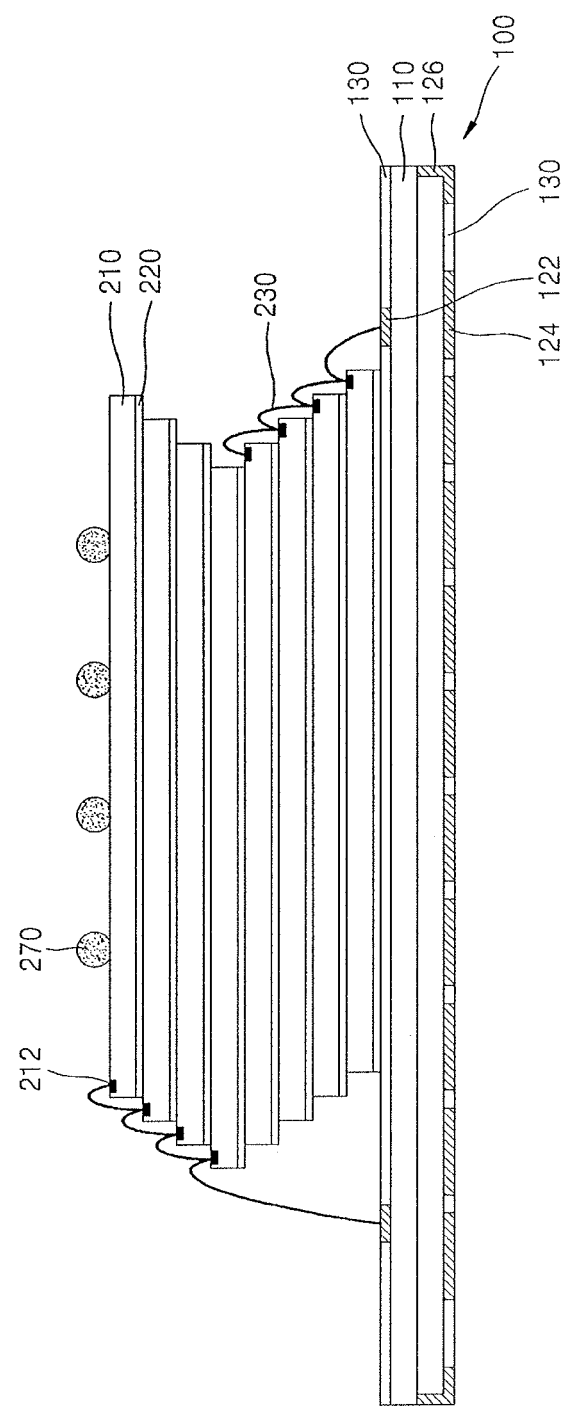
FIGS. 24 and 25 illustrate cross-sectional views of stages in a process of manufacturing a semiconductor package according to an embodiment.
Figure 25:
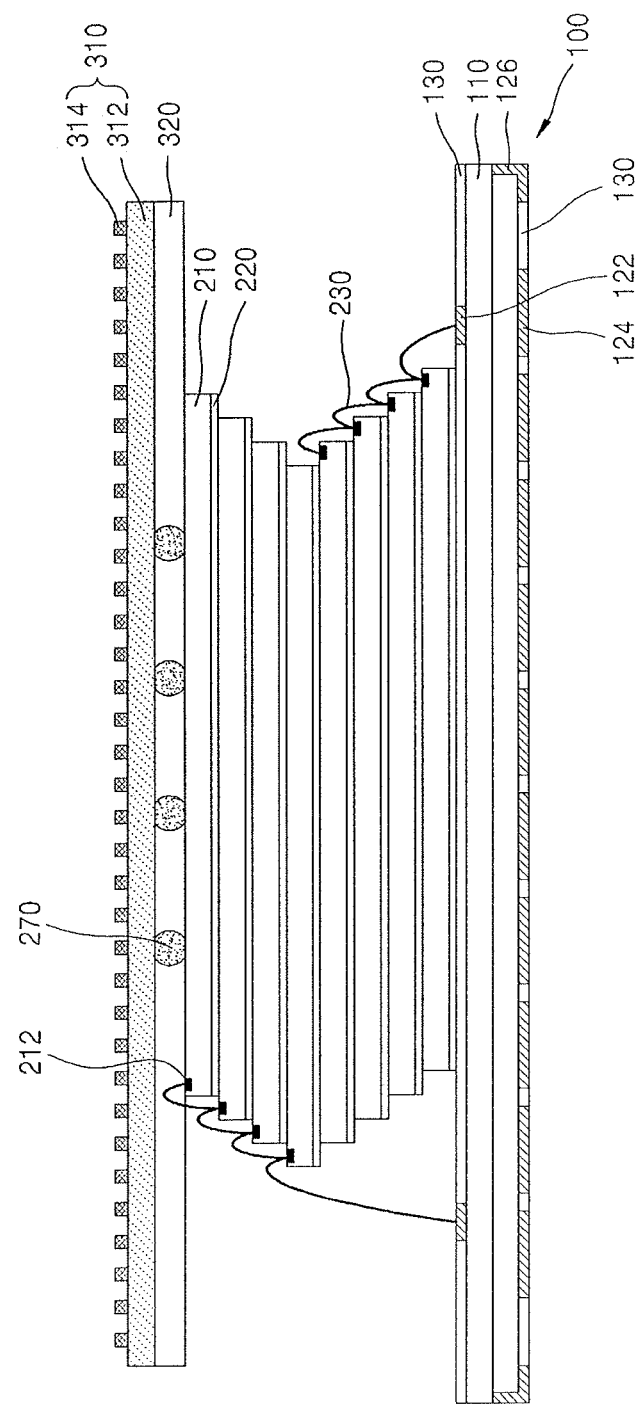

FIGS. 24 and 25 illustrate cross-sectional views of stages in a process of manufacturing a semiconductor package according to an embodiment. For example, FIGS. 24 and 25 illustrate cross-sectional views of stages in a process of manufacturing the semiconductor package 1*d* shown in FIG. 5.

Referring to FIG. 24, identically to description given above with reference to FIG. 13, a semiconductor chip 210 may be attached on a package base substrate 100, and a bonding wire 230 that connects a semiconductor chip pad 212 of the semiconductor chip 210 to a first connection pad 122 of the package base substrate 100 may be formed.

In this case, a plurality of conductive bumps 270 may be on a top of the semiconductor chip 210. In an implementation, if a plurality of the semiconductor chips 210 are stacked on the package base substrate 100, the conductive bumps 270 may be only on a semiconductor chip 210, located at an uppermost stage, of the plurality of semiconductor chips 210.

Referring to FIG. 25, a heat sink 310 including a bottom attached on a heat sink attach film 320 may be attached on the semiconductor chip 210. A portion of the bonding wire 230 connected to the semiconductor chip pad 212 of the semiconductor chip 210 may be buried in the heat sink attach film 320.

The heat sink 310 including the bottom attached on the heat sink attach film 320 may be attached on the semiconductor chip 210 so that the plurality of conductive bumps 270 pass through the heat sink attach film 320 and contact the bottom of the heat sink 310, and a bottom of the heat sink attach film 320 contacts the top of the semiconductor chip 210. To this end, the plurality of conductive bumps 270 may have a thickness that is approximately the same as that of the heat sink attach film 320.

Subsequently, identically to descriptions given above with reference to FIGS. 15 and 16, a molding 400 and an electromagnetic shield 500 may be formed, and as shown in FIG. 5, the semiconductor package 1d may be formed by attaching a plurality of external connection terminals 600 on a plurality of second connection pads 124 on the bottom of the package base substrate 100.

Figure 26:
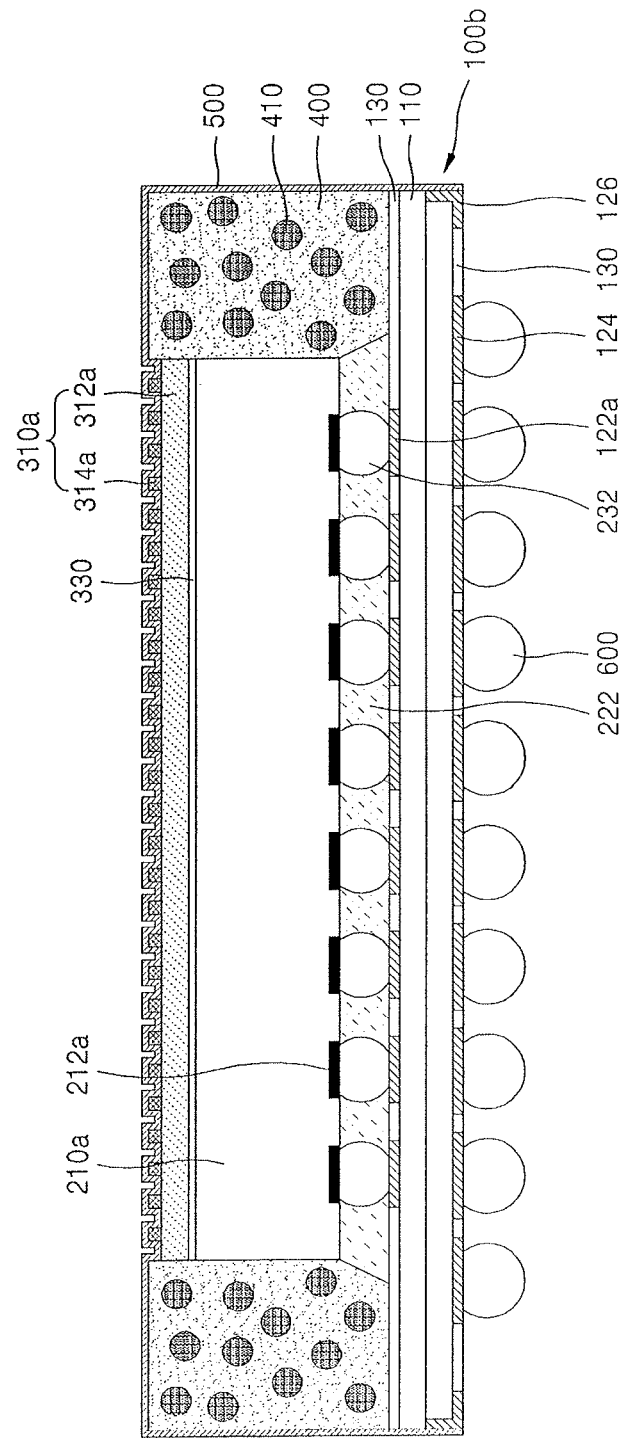
FIG. 26 illustrates a cross-sectional view of a semiconductor package according to an embodiment.

FIG. 26 illustrates a cross-sectional view of a semiconductor package 2 according to an embodiment.

Referring to FIG. 26, the semiconductor package 2 may include a package base substrate 100b, a semiconductor chip 210a, and a heat sink 310a.

The package base substrate 100b may include at least one base layer 110, a plurality of first connection pads 122 on a top of the package base substrate 100b, a plurality of second connection pads 124 on a bottom of the package base substrate 100, and at least one electromagnetic shielding terminal 126 exposed at a side surface of the base layer 110. A solder resist layer 130 may be on each of a top and a bottom of the base layer 110.

At least one semiconductor chip 210a may be mounted on the package base substrate 100b. The semiconductor chip 210a may include a plurality of semiconductor chip pads 212a on an active surface. At least one of the semiconductor chip pads 212a may be electrically connected to the plurality of first connection pads 122a. The semiconductor chip 210a may be electrically connected to the plurality of first connection pads 122a through a chip connection terminal 232 attached on the plurality of semiconductor chip pads 212a in a flip chip manner.

In an implementation, the semiconductor package 2 may include a plurality of semiconductor chips that are vertically stacked on the package base substrate 100b. Each of the plurality of semiconductor chips may be electrically connected to the package base substrate 100b through a through electrode passing through a semiconductor chip thereunder.

A heat sink 310a may be attached on the semiconductor chip 210a. The heat sink 310a may be attached on the semiconductor chip 210a with a thermal interface material (TIM) layer 330 therebetween. The TIM layer 330 may include an insulating material, or may include a material capable of maintaining electrical insulating properties, in addition to an insulating material. The TIM layer 330 may include, e.g., an epoxy resin. The TIM layer 330 may include, e.g., mineral oil, grease, gap filler putty, phase change gel, phase change material pads, or particle filled epoxy.

A horizontal area of the heat sink 310a may be less than a horizontal area of the package base substrate 100b. The horizontal area of the heat sink 310a may be approximately the same as a horizontal area of the semiconductor chip 210a. The heat sink 310a may overlap the semiconductor chip 210a in a vertical direction.

The heat sink 310a may include a base 312a and a plurality of protrusion patterns 314a on a top of the base 312a. A configuration of the heat sink 310a is similar to that of the heat sink 310 described above with reference to FIG. 1, and thus, its detailed description may be omitted.

The semiconductor package 2 may further include a molding 400. The molding 400 may include a filler 410.

The molding 400 may surround the semiconductor chip 210a and the heat sink 310a on the package base substrate 100b. The molding 400 may cover, e.g., the top of the package base substrate 100b, a side surface of the semiconductor chip 210a, and a side surface of the heat sink 310a. The molding 400 may be formed as an exposed-type mold which does not cover the top of the heat sink 310a.

An electromagnetic shield 500 may be provided on a surface of the semiconductor package 2. The electromagnetic shield 500 may cover all of a surface of the semiconductor package 2 except a bottom of the semiconductor package 2. For example, the electromagnetic shield 500 may cover a side surface of the package base substrate 100b, a side surface and a top of the molding 400, and a surface of the heat sink 310a.

The electromagnetic shield 500 may contact the at least one electromagnetic shielding terminal 126. For example, the electromagnetic shield 500 may contact the at least one electromagnetic shielding terminal 126 at a side surface of the package base substrate 100b.

The semiconductor package 2 may further include a plurality of external connection terminals 600. The plurality of external connection terminals 600 may be attached on the plurality of second connection pads 124 on the bottom of the package base substrate 100b.

In the semiconductor package 2 according to an embodiment, heat occurring in the semiconductor package 2 (e.g., heat occurring in the semiconductor chip 210a) may be effectively dissipated to the outside by the heat sink 310a including the top that is exposed without being covered by the molding 400. The plurality of protrusion patterns 314a formed by filling a metal material into a through hole of an anodically oxidized aluminum oxide layer may be disposed on the top of the heat sink 310a, and thus, a surface area of the heat sink 310a may increase. Accordingly, heat dissipation efficiency increases without any increase in volume of the semiconductor package 2 or area of the top of the semiconductor package 2.

In an implementation, in the semiconductor package 2, the electromagnetic shield 500 may form an embossing pattern on the heat sink 310a where the plurality of protrusion patterns 314a are disposed, and thus, may efficiently absorb an electromagnetic wave radiated from the inside of the semiconductor package 2 to the top of the semiconductor package 2, thereby preventing the electromagnetic wave from being radiated to the outside of the semiconductor package 2.

In the semiconductor package according to the embodiments, the top of the semiconductor package may be exposed without being covered by the molding, and the plurality of protrusion patterns (e.g., formed by filling a metal material into the through hole of the anodically oxidized aluminum oxide layer) may be on the top of the heat sink, whereby heat generated in the semiconductor package may be effectively dissipated to the outside by the heat sink having an increased surface area. Accordingly, heat dissipation efficiency increases without any increase in volume of the semiconductor package or area of the top of the semiconductor package.

The plurality of protrusion patterns of the heat sink may not protrude to a level higher than a top of the molding, damage of the plurality of protrusion patterns may be reduced and/or prevented.

In an implementation, in the semiconductor package, the electromagnetic shield may configure or form the embossing pattern on the heat sink where the plurality of protrusion patterns are disposed, the heat sink may act as a shield, and due to an effect of the embossing pattern, an electromagnetic wave radiated from the inside of the semiconductor package may be efficiently reflected and absorbed, thereby preventing the electromagnetic wave from being radiated to the outside of the semiconductor package.

By way of summation and review, heat generation may increase in semiconductor chips included in the semiconductor packages, which could cause a reduction in performance of semiconductor packages.

The embodiments may provide a semiconductor package including a heat sink, which effectively dissipates heat.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a package base substrate;
at least one semiconductor chip on the package base substrate such that an active surface of the at least one semiconductor chip faces the package base substrate;
a heat sink attached on an inactive surface opposite to the active surface of the at least one semiconductor chip, the heat sink including a base and a plurality of protrusion patterns on a top of the base; and
a molding covering a top of the package base substrate, a side surface of the at least one semiconductor chip, and a side surface of the heat sink without covering a top of the heat sink,
wherein:
the molding includes a filler, and
a diameter of particles of the filler is greater than an interval between adjacent protrusion patterns of the plurality of protrusion patterns.

2. The semiconductor package as claimed in claim 1, wherein:
the at least one semiconductor chip includes a plurality of semiconductor chip pads on an active surface,
the package base substrate includes a plurality of first connection pads on a top of the package base substrate, and
the plurality of semiconductor chip pads is electrically connected to each of the plurality of first connection pads through a plurality of chip connection terminal attached on the plurality of semiconductor chip pads.

3. The semiconductor package as claimed in claim 1, wherein an uppermost end of the molding and a top of each of the plurality of protrusion patterns of the heat sink are on a same level.

4. The semiconductor package as claimed in claim 1, wherein the plurality of protrusion patterns of the heat sink is arranged in a honeycomb structure on the top of the base.

5. The semiconductor package as claimed in claim 1, wherein each protrusion pattern of the plurality of protrusion patterns has a circular horizontal cross-sectional surface.

6. The semiconductor package as claimed in claim 1, further comprising:
a bonding wire electrically connecting the at least one semiconductor chip to the package base substrate; and
a heat sink attach film between the at least one semiconductor chip and the heat sink, the heat sink attach film having a same horizontal area as a horizontal area of the heat sink,
wherein:
a portion of the bonding wire is buried in the heat sink attach film, and
the bonding wire is spaced apart from the heat sink without contacting the heat sink.

7. The semiconductor package as claimed in claim 1, wherein:
a horizontal area of the heat sink is greater than a horizontal area of the at least one semiconductor chip, and
the heat sink overlaps all of the at least one semiconductor chip in a vertical direction.

8. The semiconductor package as claimed in claim 1, wherein a horizontal area of the heat sink is the same as a horizontal area of the at least one semiconductor chip.

9. The semiconductor package as claimed in claim 1, further comprising an electromagnetic shield covering a side surface of the package base substrate, a side surface and a top of the molding, and a top of the heat sink.

10. The semiconductor package as claimed in claim 9, wherein a portion of the electromagnetic shield on the heat sink forms an embossing pattern that includes a top having a concave-convex structure.

11. The semiconductor package as claimed in claim 9, wherein the electromagnetic shield fills a space between protrusion patterns of the plurality of protrusion patterns and has a flat top on the heat sink.

12. A semiconductor package, comprising:
a package base substrate, the package base substrate including a plurality of first connection pads on a top of the package base substrate and a plurality of second connection pads on a bottom of the package base substrate;
a semiconductor chip on the package base substrate such that an active surface of the semiconductor chip faces the package base substrate, the semiconductor chip including a plurality of semiconductor chip pads on the active surface, the plurality of semiconductor chip pads being electrically connected to each of the plurality of first connection pads;
a heat sink attached on the semiconductor chip, the heat sink including a base and a plurality of protrusion patterns on a top of the base;
a molding covering a top of the package base substrate, a side surface of the semiconductor chip, and a side surface of the heat sink without covering a top of the heat sink; and
a plurality of external connection terminals attached on the plurality of second connection pads,
wherein:
the molding includes a filler, and
a diameter of particles of the filler is greater than an interval between adjacent protrusion patterns of the plurality of protrusion patterns.

13. The semiconductor package as claimed in claim 12, wherein an uppermost end of the molding and a top of each of the plurality of protrusion patterns of the heat sink are on a same level.

14. The semiconductor package as claimed in claim 12, wherein the plurality of protrusion patterns of the heat sink is arranged in a honeycomb structure on the top of the base.

15. The semiconductor package as claimed in claim 12, wherein each protrusion pattern of the plurality of protrusion patterns has a circular horizontal cross-sectional surface.

16. The semiconductor package as claimed in claim 12, wherein a horizontal area of the heat sink is the same as a horizontal area of the semiconductor chip.

17. The semiconductor package as claimed in claim 12, further comprising an electromagnetic shield covering a side surface of the package base substrate, a side surface and a top of the molding, and a top of the heat sink,
   wherein a portion of the electromagnetic shield on the heat sink forms an embossing pattern that includes a top having a concave-convex structure.

18. The semiconductor package as claimed in claim 12, further comprising an electromagnetic shield covering a side surface of the package base substrate, a side surface and a top of the molding, and a top of the heat sink,
   wherein the electromagnetic shield fills a space between protrusion patterns of the plurality of protrusion patterns and has a flat top on the heat sink.

19. The semiconductor package as claimed in claim 12, wherein the semiconductor chip includes a plurality of chips that are vertically stacked on the package base substrate.

* * * * *